United States Patent
Levinshtein et al.

(10) Patent No.: US 10,366,276 B2
(45) Date of Patent: Jul. 30, 2019

(54) INFORMATION PROCESSING DEVICE AND COMPUTER PROGRAM

(71) Applicant: SEIKO EPSON CORPORATION, Tokyo (JP)

(72) Inventors: Alex Levinshtein, Vaughan (CA); Guoyi Fu, Vaughan (CA)

(73) Assignee: SEIKO EPSON CORPORATION, Tokyo (JP)

( * ) Notice: Subject to any disclaimer, the term of this patent is extended or adjusted under 35 U.S.C. 154(b) by 302 days.

(21) Appl. No.: 15/451,062

(22) Filed: Mar. 6, 2017

(65) Prior Publication Data
US 2017/0286750 A1 Oct. 5, 2017

(30) Foreign Application Priority Data
Mar. 29, 2016 (JP) ................. 2016-065733

(51) Int. Cl.
*G06K 9/00* (2006.01)
*G06T 7/73* (2017.01)
(Continued)

(52) U.S. Cl.
CPC ......... *G06K 9/00201* (2013.01); *G06F 17/50* (2013.01); *G06K 9/4604* (2013.01); *G06K 9/6202* (2013.01); *G06K 9/6215* (2013.01); *G06K 9/78* (2013.01); *G06T 7/13* (2017.01); *G06T 7/74* (2017.01); *G06T 7/75* (2017.01); *G06T 2200/04* (2013.01); *G06T 2207/10004* (2013.01)

(58) Field of Classification Search
CPC .... G06K 9/00201; G06K 9/78; G06K 9/6215; G06K 9/6202; G06K 9/4604; G06T 7/74; G06T 7/13; G06T 7/75; G06T 2200/04; G06T 2207/10004; G06F 17/50
See application file for complete search history.

(56) References Cited

U.S. PATENT DOCUMENTS

| | | | |
|---|---|---|---|
| 7,889,193 | B2 | 2/2011 | Platonov et al. |
| 9,013,617 | B2 | 4/2015 | Ramachandran et al. |

(Continued)

FOREIGN PATENT DOCUMENTS

JP 2013-050947 A 3/2013

OTHER PUBLICATIONS

You et al; "Hybrid Inertial and Vision Tracking for Augmented Reality Registration;" Virtual Reality, 1999; Proceedings., IEEE, Date of Conference: Mar. 13-17, 1999; DOI: 10.1109/VR.1999. 756960; 8 pp.

(Continued)

*Primary Examiner* — Carol Wang
(74) *Attorney, Agent, or Firm* — Oliff PLC

(57) ABSTRACT

An information processing device which processes information regarding a 3D model corresponding to a target object, includes a template creator that creates a template in which feature information and 3D locations are associated with each other, the feature information representing a plurality of 2D locations included in a contour obtained through a projection of the prepared 3D model onto a virtual plane based on a viewpoint, and the 3D locations corresponding to the 2D locations and being represented in a 3D coordinate system, the template being correlated with the viewpoint.

8 Claims, 19 Drawing Sheets

(51) Int. Cl.
*G06T 7/13* (2017.01)
*G06F 17/50* (2006.01)
*G06K 9/46* (2006.01)
*G06K 9/62* (2006.01)
*G06K 9/78* (2006.01)

(56) References Cited

U.S. PATENT DOCUMENTS

| | | | |
|---|---|---|---|
| 9,111,347 B2 | 8/2015 | Ben Himane | |
| 2003/0035098 A1* | 2/2003 | Ishiyama | G06K 9/00234 356/72 |
| 2007/0213128 A1 | 9/2007 | Ohta | |
| 2008/0310757 A1* | 12/2008 | Wolberg | G06K 9/00208 382/285 |
| 2009/0096790 A1* | 4/2009 | Wiedemann | G06K 9/00201 345/427 |
| 2010/0289797 A1 | 11/2010 | Tateno et al. | |
| 2012/0268567 A1* | 10/2012 | Nakazato | G01B 11/03 348/46 |
| 2013/0051626 A1 | 2/2013 | Abadpour et al. | |
| 2015/0243031 A1* | 8/2015 | Narasimha | G06K 9/00268 382/103 |
| 2015/0317821 A1* | 11/2015 | Ding | G06T 7/00 345/420 |
| 2016/0187970 A1 | 6/2016 | Ashforth et al. | |
| 2016/0282619 A1 | 9/2016 | Oto et al. | |
| 2016/0292889 A1* | 10/2016 | Niwayama | G06T 7/75 |
| 2017/0045736 A1 | 2/2017 | Fu | |
| 2018/0113505 A1 | 4/2018 | Choi et al. | |
| 2018/0157344 A1 | 6/2018 | Toff | |

OTHER PUBLICATIONS

Azuma et al; "A Survey of Augmented Reality;" Presence: Teleoperators and Virtual Environments; vol. 6; No. 4; Aug. 1997; pp. 355-385.
Ligorio et al; "Extended Kalman Filter-Based Methods for Pose Estimation Using Visual, Inertial and Magnetic Sensors: Comparative Analysis and Performance Evaluation;" Sensors; 2013; vol. 13; DOI: 10.3390/s130201919; pp. 1919-1941.
U.S. Appl. No. 15/625,174, filed Jun. 16, 2017 in the name of Yang Yang et al.
U.S. Appl. No. 15/854,277, filed Dec. 26, 2017 in the name of Yang Yang et al.
Hinterstoisser, Stefan et al. "Gradient Response Maps for Real-Time Detection of Texture-Less Objects". IEEE Transactions on Pattern Analysis and Machine Intelligence, pp. 1-14.
U.S. Appl. No. 15/937,229, filed Mar. 27, 2018 in the name of Tong Qiu et al.
Sep. 19, 2018 Office Action issued in U.S. Appl. No. 15/937,229.
Aug. 30, 2017 extended Search Report issued in European Patent Application No. 17163433.0.
Ulrich et al; "CAD-Based Recognition of 3D Objects in Monocular Images;" 2009 IEEE Conference on Robotics and Automation; XP031509745; May 12, 2009; pp. 1191-1198.

* cited by examiner

INFORMATION PROCESSING DEVICE AND COMPUTER PROGRAM

BACKGROUND

1. Technical Field

The present invention relates to a technique of an information processing device which processes information regarding a three-dimensional model of a target object.

2. Related Art

As a method of estimating a pose of an object imaged by a camera, JP-A-2013-50947 discloses a technique in which a binary mask of an input image including an image of an object is created, singlets as points in inner and outer contours of the object are extracted from the binary mask, and sets of the singlets are connected to each other so as to form a mesh represented as a duplex matrix so that a pose of the object is estimated.

SUMMARY

However, in the technique disclosed in JP-A-2013-50947, processing time required to estimate a pose of the object imaged by the camera may be long, or the accuracy of the estimated pose may not be high enough.

An advantage of some aspects of the invention is to solve at least a part of the problems described above, and the invention can be implemented as the following aspects.

(1) According to an aspect of the invention, an information processing device which processes information on a 3D model corresponding to a target object is provided. The information processing device includes a template creator that creates a template in which feature information and 3D locations are associated with each other, the feature information representing a plurality of 2D locations included in a contour obtained from a projection of the 3D model onto a virtual plane based on a viewpoint, and the 3D locations corresponding to the 2D locations and being represented in a 3D coordinate system, the template being correlated with the viewpoint.

(2) In the information processing device according to the aspect, the template creator may create a super-template in which the template, as a first template, and second templates are merged, the first template being correlated with the viewpoint as a first viewpoint, and the second templates being correlated with respective second viewpoints that are different from the first viewpoint. According to the information processing device of the aspect, in a case where a target object is imaged by a camera or the like, a template including a pose closest to that of the imaged target object is selected from among a plurality of templates included in a the super-template. A pose of the imaged target object is estimated with high accuracy within a shorter period of time by using the selected template.

(3) According to another aspect of the invention, an information processing device is provided. The information processing device includes a communication section capable of communicating with an imaging section that captures an image of a target object; a template acquisition section that acquires at least one template in which first feature information, 3D locations and a viewpoint are associated with each other, the first feature information including information that represents a plurality of first 2D locations included in a contour obtained from a projection of a 3D model corresponding to the target object onto a virtual plane based on the viewpoint, and the 3D locations corresponding to the respective first 2D locations and being represented in a 3D coordinate system; a location-correspondence determination section that identifies second feature information representing edges from the captured image of the target object obtained from the imaging section, and determines correspondences between the first 2D locations and second 2D locations in the captured image based at least on the first feature information and the second feature information; and a section that derives a position and pose of the target object, using at least (1) the 3D locations that correspond to the respective first 2D locations and (2) the second 2D locations that correspond to the respective first 2D locations.

(4) In the information processing device according to the aspect, the location-correspondence determination section may derive similarity scores between each of the first 2D locations and the second 2D locations within a region around the corresponding first 2D location, smooth the similarity scores derived with respect to the region, using other similarity scores derived with respect to other regions around other first 2D locations adjacent to the corresponding first 2D location, and determine a correspondence between each of the first 2D locations and one of the second 2D locations within the region around the corresponding first 2D location based on at least the smoothed similarity scores. According to the information processing device of the aspect, the location-correspondence determination section matches the first feature information with the second feature information with high accuracy by increasing similarity scores. As a result, the section can estimate a pose of the imaged target object with high accuracy.

(5) In the information processing device according to the aspect, the first feature information may include contour information representing an orientation of the contour at each of the first 2D locations, and the location-correspondence determination section may derive the similarity scores between each of the first 2D locations and the second 2D locations that overlap a first line segment perpendicular to the contour at the corresponding first 2D location within the region around the corresponding first 2D location. According to the information processing device of the aspect, similarity scores can be further increased, and thus the section can estimate a pose of the imaged target object with higher accuracy.

(6) In the information processing device according to the aspect, the first feature information may include contour information representing an orientation of the contour at each of the first 2D locations, and the location-correspondence determination section may (1) derive the similarity scores between each of the first 2D locations and the second 2D locations that overlap a first line segment perpendicular to the contour at the corresponding first 2D location within the region around the corresponding first 2D location, and (2) derive the similarity scores between each of the first 2D locations and the second 2D locations that overlap a second segment perpendicular to the first line segment, using a Gaussian function defined at least by a center of a function at a cross section of the first line segment and the second line segment.

(7) In the information processing device according to the aspect, the 3D model may be a 3D CAD model. According to the information processing device of the aspect, an existing CAD model is used, and thus a user's convenience is improved.

The invention may be implemented in forms aspects other than the information processing device. For example, the invention may be implemented in forms such as a head mounted display, a display device, a control method for the information processing device and the display device, an information processing system, a computer program for realizing functions of the information processing device, a recording medium recording the computer program thereon, and data signals which include the computer program and are embodied in carrier waves.

BRIEF DESCRIPTION OF THE DRAWINGS

The invention will be described with reference to the accompanying drawings, wherein like numbers reference like elements.

DESCRIPTION OF EXEMPLARY EMBODIMENTS

In the present specification, description will be made in order according to the following items.

Figure 1:
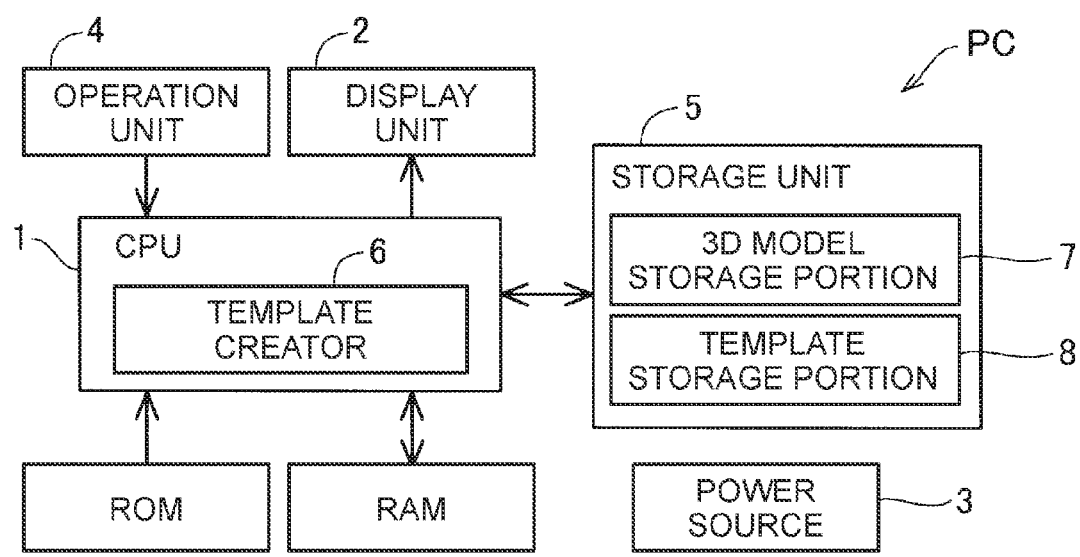
FIG. 1 is a block diagram illustrating a functional configuration of a personal computer as an information processing device in the present embodiment.

A. First Embodiment
A-1. Configuration of information processing device
A-2. Creation of template (training)
A-2-1. Selection of 2D model point
A-2-2. Determination of 3D model point and creation of template
A-2-3. In-plane rotation optimization for training
A-2-4. Super-template
A-3. Configuration of head mounted display (HMD)
A-4. Execution of estimation of target object pose
A-4-1. Edge detection
A-4-2. Selection of template
A-4-3. 2D model point correspondences
A-4-4. Optimization of pose
A-4-5. Subpixel correspondences
B. Comparative Example
C. Second Embodiment
D. Third Embodiment
E. Modification Examples A. First Embodiment A-1. Configuration of Information Processing Device FIG. 1 is a block diagram illustrating a functional configuration of a personal computer PC as an information processing device in the present embodiment. The personal computer PC includes a CPU 1, a display unit 2, a power source 3, an operation unit 4, a storage unit 5, a ROM, and a RAM. The power source 3 supplies power to each unit of the personal computer PC. As the power source 3, for example, a secondary battery may be used. The operation unit 4 is a user interface (UI) for receiving an operation from a user. The operation unit 4 is constituted of a keyboard and a mouse.

The storage unit 5 stores various items of data, and is constituted of a hard disk drive and the like. The storage unit 5 includes a 3D model storage portion 7 and a template storage portion 8. The 3D model storage portion 7 stores a three-dimensional model of a target object, created by using computer-aided design (CAD). The template storage portion 8 stores a template created by a template creator 6. Details of the template created by the template creator 6 will be described later.

The CPU 1 reads various programs from the ROM and develops the programs in the RAM, so as to execute the various programs. The CPU 1 includes the template creator 6 which executes a program for creating a template. The template is defined as data in which, with respect to a single three-dimensional model (3D CAD in the present embodiment) stored in the 3D model storage portion 7, coordinate values of points (2D model points) included in a contour line (hereinafter, also simply referred to as a "contour") representing an exterior of a 2D model obtained by projecting the 3D model onto a virtual plane on the basis of a virtual specific viewpoint (hereinafter, also simply referred to as a "view"), 3D model points obtained by converting the 2D model points into points in an object coordinate system on the basis of the specific view, and the specific view are correlated with each other. The virtual viewpoint of the present embodiment is represented by a rigid body transformation matrix used for transformation from the object coordinate system into a virtual camera coordinate system and represented in the camera coordinate system, and a perspective projection transformation matrix for projecting three-dimensional coordinates onto coordinates on a virtual plane. The rigid body transformation matrix is expressed by a rotation matrix representing rotations around three axes which are orthogonal to each other, and a translation vector representing translations along the three axes. The perspective projection transformation matrix is appropriately adjusted so that the virtual plane corresponds to a display surface of a display device or an imaging surface of the camera. A CAD model may be used as the 3D model as described later. Hereinafter, performing rigid body transformation and perspective projection transformation on the basis of a view will be simply referred to as "projecting".

A-2. Creation of Template (Training)

Figure 2:
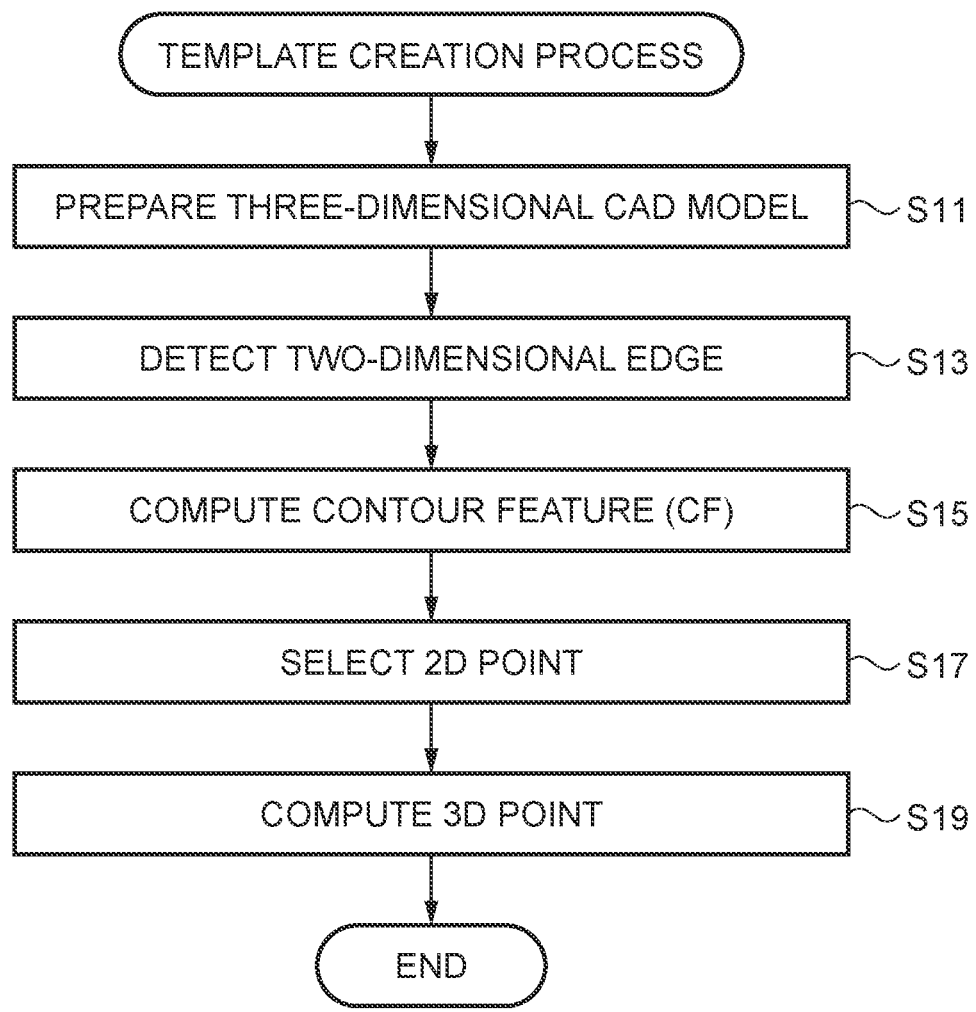
FIG. 2 is a flowchart illustrating a template creation process performed by a template creator.

FIG. 2 is a flowchart illustrating a template creation process performed by the template creator 6. The template creator 6 creates T templates obtained when a three-dimensional model for a target object stored in the 3D model storage portion 7 is viewed from T views. In the present embodiment, creation of a template will also be referred to as "training".

In the template creation process, first, the template creator 6 prepares a three-dimensional model stored in the 3D model storage portion 7 (step S11). Next, the template creator 6 renders CAD models by using all possible in-plane rotations (1, . . . , and P) for each of different t views, so as to obtain respective 2D models thereof. Each of the views is an example of a specific viewpoint in the SUMMARY. The template creator 6 performs edge detection on the respective 2D models so as to acquire edge features (step S13).

The template creator 6 computes contour features (CF) indicating a contour of the 2D model on the basis of the edge features for each of T (P×t) views (step S15). If a set of views which are sufficiently densely sampled is provided, a view having contour features that match image points which will be described later can be obtained. The 2D model points are points representing a contour of the 2D model on the virtual plane or points included in the contour. The template creator 6 selects representative 2D model points from among the 2D model points in the 2D contour with respect to each sample view as will be described in the next section, and computes descriptors of the selected features. The contour feature or the edge feature may also be referred to as a feature descriptor, and is an example of feature information in the SUMMARY.

If computation of the contour features in the two dimensions is completed, the template creator 6 selects 2D contour features (step S17). Next, the template creator 6 computes 3D points having 3D coordinates in the object coordinate system corresponding to respective descriptors of the features (step S19).

A-2-1. Selection of 2D Model Points (Step S17)

The template creator 6 selects N points which are located at locations where the points have high luminance gradient values (hereinafter, also referred to as "the magnitude of gradient") in a scalar field and which are sufficiently separated from each other from among points disposed in the contour with respect to each sample view. Specifically, the template creator 6 selects a plurality of points which maximize a score expressed by the following Equation (1) from among all points having sufficient large magnitudes of gradient.

$$\sum_{i=1}^{N} [E_i \min_{j \neq i} \{D_{ij}^2\}] \qquad (1)$$

In Equation (1), $E_i$ indicates a magnitude of gradient of a point i, and $D_{ij}$ indicates a distance between the point i and a point j. In the present embodiment, in order to maximize a score shown in Equation (1), first, the template creator 6 selects a point having the maximum magnitude of gradient as a first point. Next, the template creator 6 selects a second point which maximizes $E_2 D_{21}^2$. Next, the template creator 6 selects a third point which maximizes the following Equation (2). Then, the template creator 6 selects a fourth point, a fifth point, . . . , and an N-th point.

$$E_3 \min_{j=\{1,2\}} \{D_{3j}^2\} \qquad (2)$$

Figure 3:
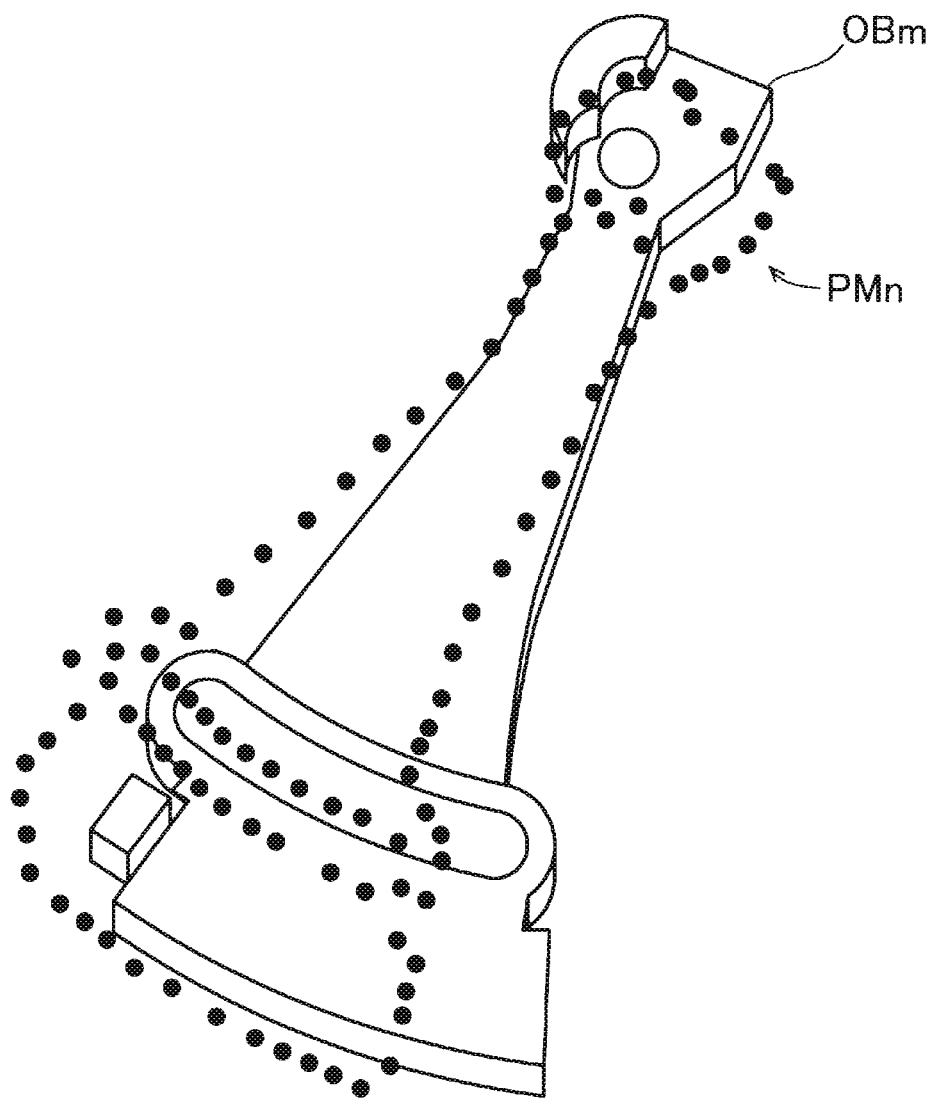
FIG. 3 is a diagram for explaining a set of N points in two dimensions representing a target object for a three-dimensional model, calculated by using Equation (1).

FIG. 3 is a diagram illustrating a set PMn of N 2D model points calculated by using Equation (1). In FIG. 3, the set PMn of 2D model points is displayed to overlap a captured image of a target object OBm. In order to differentiate the captured image of the target object OBm from the 2D model set PMn, a position of the target object OBm is deviated relative to the set PMn. As illustrated in FIG. 3, the set PMn of 2D model points which is a set of dots calculated by using Equation (1) is distributed so as to substantially match a contour of the captured image of the target object OBm. If the set PMn of 2D model points is calculated, the template creator 6 correlates a position, or location, of the 2D model point with gradient (vector) of luminance at the position, and stores the correlation result as a contour feature at the position.

A-2-2. Determination of 3D Model Point and Creation of Template (Steps S19 and S20)

The template creator 6 calculates 3D model points corresponding to the calculated set PMn of 2D model points. The combination of the 3D model points and contour features depends on views.

If a 2D model point and a view V are provided, the template creator 6 computes a 3D model point $P_{OBJ}$ by the following three steps.

1. A depth map of a 3D CAD model in the view V is drawn (rendered) on the virtual plane.

2. If a depth value of a 2D model point p is obtained, 3D model coordinates $P_{CAM}$ represented in the camera coordinate system are computed.

3. Inverse 3D transformation is performed on the view V, and coordinates $P_{OBJ}$ of a 3D model point in the object coordinate system (a coordinate system whose origin is fixed to the 3D model) are computed.

As a result of executing the above three steps, the template creator 6 creates, into a single template, a view matrix $V_t$ for each view t expressed by the following Expression (3), 3D model points in the object coordinate system associated with respective views expressed by the following Expression (4), and descriptors of 2D features (hereinafter, also referred to as contour features) corresponding to the 3D model points in the object coordinate system and associated with the respective views, expressed by the following Expression (5).

$$t \in \{1, \ldots, T\} \qquad (3)$$

$$\{P_1, \ldots, P_N\}_t \qquad (4)$$

$$\{CF_1, \ldots, CF_N\}_t \qquad (5)$$

Figure 4:
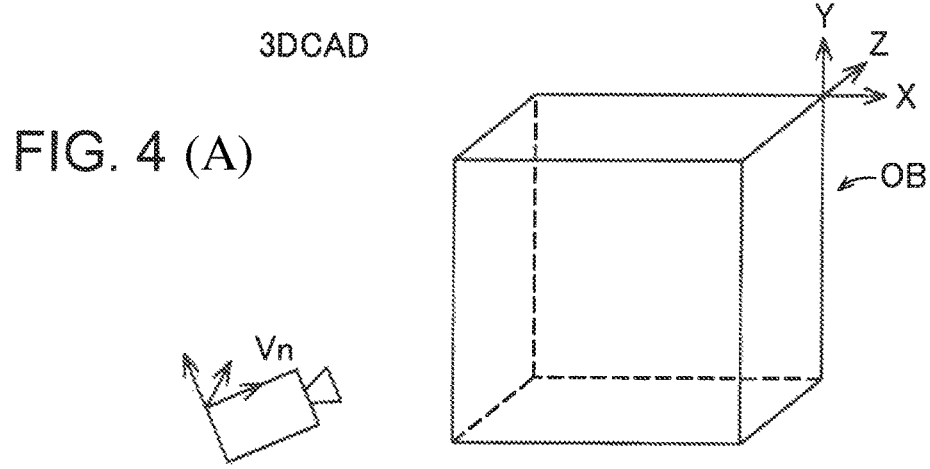
FIGS. 4A-4C are a schematic diagram illustrating a relationship among 3D CAD, a 2D model, and a 3D model created on the basis of the 2D model.
Figure 4:
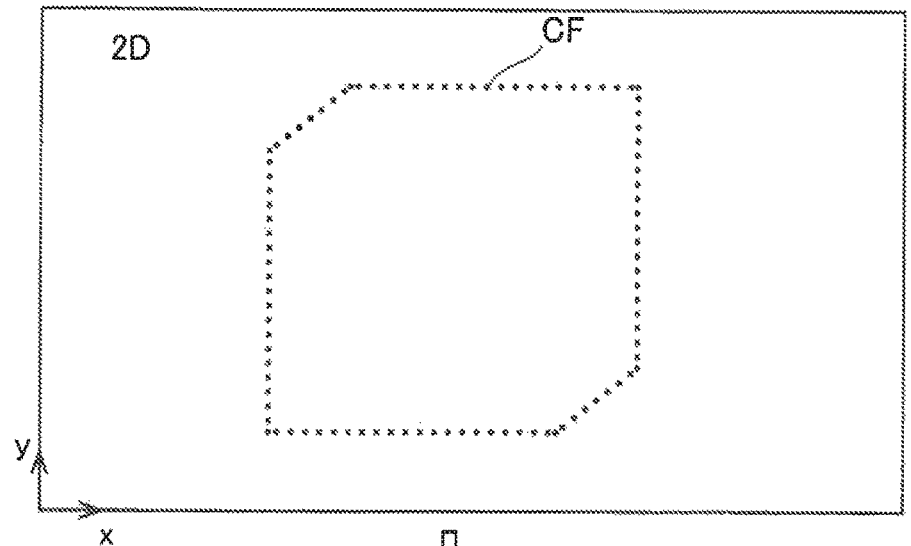
Figure 4:
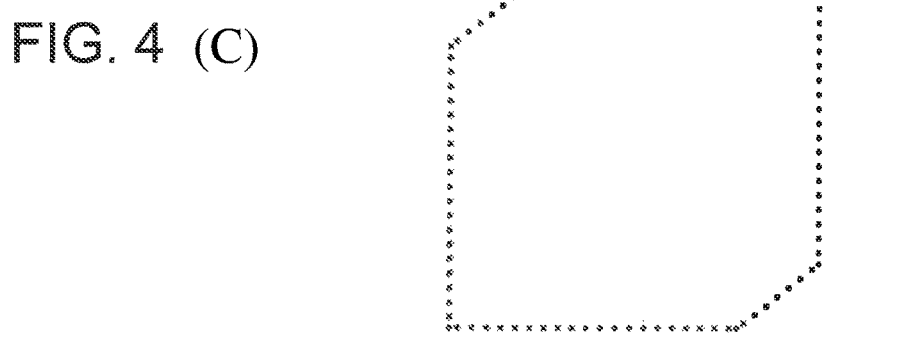

FIGS. 4A-4C are a schematic diagram illustrating a relationship among 3D CAD, a 2D model obtained by projecting the 3D CAD, and a 3D model created on the basis of the 2D model. As illustrated in FIGS. 4A-4C as an image diagram illustrating the template creation process described above, the template creator 6 renders the 2D model on the virtual plane on the basis of a view $V_n$ of the 3D CAD as a 3D model. The template creator 6 detects edges of an image obtained through the rendering, further extracts a contour, and selects a plurality of 2D model points included in the contour on the basis of the method described with reference to Equations (1) and (2). Hereinafter, a position of a selected 2D model point and gradient (a gradient vector of luminance) at the position of the 2D model point are represented by a contour feature CF. The template creator 6 performs inverse transformation on a 2D model point $p_i$ represented by a contour feature $CF_i$ in the two dimensional space so as to obtain a 3D model point $P_i$ in the three dimensional space corresponding to the contour feature $CF_i$. Here, the 3D model point $P_i$ is represented in the object coordinate system. The template in the view $V_n$ includes elements expressed by the following Expression (6).

$$(CF_{1n}, CF_{2n}, \ldots, 3DP_{1n}, 3DP_{2n}, \ldots, V_n) \quad (6)$$

In Expression (6), a contour feature and a 3D model point (for example, $CF_{1n}$ and $3DP_{1n}$) with the same suffix are correlated with each other. A 3D model point which is not detected in the view $V_n$ may be detected in a view $V_m$ or the like which is different from the view $V_n$.

In the present embodiment, if a 2D model point p is provided, the template creator 6 treats the coordinates of the 2D model point p as integers representing a corner of a pixel. Therefore, a depth value of the 2D model point p corresponds to coordinates of (p+0.5). As a result, the template creator 6 uses the coordinates of (p+0.5) for inversely projecting the 2D point p. When a recovered 3D model point is projected, the template creator 6 truncates floating-point coordinates so as to obtain integer coordinates.

A-2-3. In-plane Rotation Optimization for Training

If a single view is provided, substantially the same features can be visually recognized from the single view, and thus the template creator 6 creates a plurality of templates by performing in-plane rotation on the single view. The template creator 6 can create a plurality of templates with less processing by creating the templates having undergone the in-plane rotation. Specifically, the template creator 6 defines 3D points and CF descriptors for in-plane rotation of 0 degrees in the view t according to the following Expressions (7) and (8), respectively, on the basis of Expressions (4) and (5)

$$\{P_1, \ldots, P_N\}_{t,0} \quad (7)$$

$$\{CF_1, \ldots, CF_N\}_{t,0} \quad (8)$$

The template creator 6 computes 3D model points and contour feature descriptors with respect to a template at in-plane rotation of α degrees by using Expressions (7) and (8). The visibility does not change regardless of in-plane rotation, and the 3D model points in Expression (7) are represented in the object coordinate system. From this fact, the 3D model points at in-plane rotation of α degrees are obtained by only copying point coordinates of the 3D model points at in-plane rotation of 0 degrees, and are thus expressed as in the following Equation (9).

$$\{P_1, \ldots, P_N\}_{t,\alpha} = \{P_1, \ldots, P_N\}_{t,0} \quad (9)$$

The contour features at in-plane rotation of α degrees are stored in the 2D coordinate system, and thus rotating the contour features at in-plane rotation of 0 degrees by α degrees is sufficient. This rotation is performed by applying a rotation matrix of 2×2 to each vector $CF_i$, and is expressed as in the following Equation (10).

$$CF_j^{t,\alpha} = \begin{bmatrix} \cos \alpha & \sin \alpha \\ -\sin \alpha & \cos \alpha \end{bmatrix} CF_j^{t,0} \quad (10)$$

The rotation in Equation (10) is clockwise rotation, and corresponds to the present view sampling method for training. The view t corresponds to a specific viewpoint in the SUMMARY. The set PMn of 2D model points corresponds to positions of a plurality of feature points in the two dimensions, and the 3D model points correspond to the positions of a plurality of feature points in the three dimensions, represented in the object coordinate system.

A-2-4. Super-template

The template creator 6 selects K (for example, four) templates in different views t, and merges the selected K templates into a single super-template. The template creator 6 selects templates whose views t are closest to each other as the K templates. Thus, there is a high probability that the super-template may include all edges of a target object which can be visually recognized on an object. Consequently, in a case where a detected pose of the target object is optimized, there is a high probability of convergence on an accurate pose.

As described above, in the personal computer PC of the present embodiment, the template creator 6 detects a plurality of edges in the two dimensions in a case where a three-dimensional CAD model representing a target object is viewed from a specific view. The template creator 6 computes 3D model points obtained by transforming contour features of the plurality of edges. The template creator 6 creates a template in which the plurality of edges in the two dimensions, the 3D model points obtained through transformation, and the specific view are correlated with each other. Thus, in the present embodiment, due to the templates created by, for example, the personal computer PC, the pose of the imaged target object is estimated with high accuracy and/or within a short period of time, when the target object is imaged by a camera or the like and a template representing a pose closest to the pose of the target object in the captured image is selected.

A-3. Configuration of Head Mounted Display (HMD)

Figure 5:
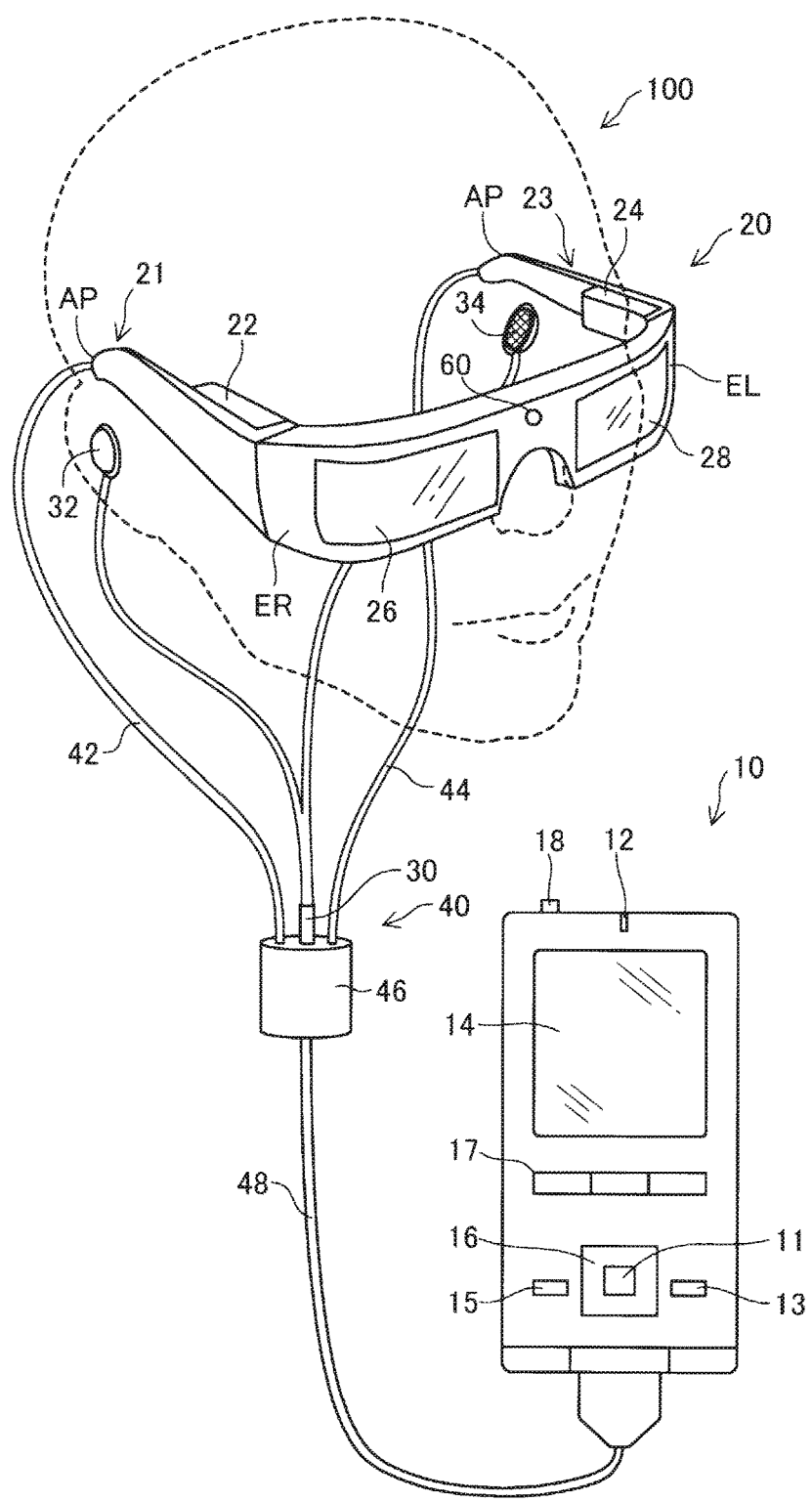
FIG. 5 is a diagram illustrating an exterior configuration of a head mounted display (HMD) which optimizes a pose of an imaged target object by using a template.

FIG. 5 is a diagram illustrating an exterior configuration of a head mounted display 100 (HMD 100) which optimizes a pose of an imaged target object by using a template. If a camera 60 which will be described later captures an image of a target object, the HMD 100 optimizes and/or estimates a position and a pose of the imaged target object by using preferably a super-template and the captured image of the target object.

The HMD 100 is a display device mounted on the head, and is also referred to as a head mounted display (HMD). The HMD 100 of the present embodiment is an optical transmission, or optical see-through, type head mounted display which allows a user to visually recognize a virtual image and also to directly visually recognize external scenery. In the present specification, for convenience, a virtual image which the HMD 100 allows the user to visually recognize is also referred to as a "display image".

The HMD 100 includes the image display section 20 which enables a user to visually recognize a virtual image in a state of being mounted on the head of the user, and a control section 10 (a controller 10) which controls the image display section 20.

The image display section 20 is a mounting body which is to be mounted on the head of the user, and has a spectacle shape in the present embodiment. The image display section 20 includes a right holding unit 21, a right display driving unit 22, a left holding unit 23, a left display driving unit 24, a right optical image display unit 26, a left optical image display unit 28, and the camera 60. The right optical image display unit 26 and the left optical image display unit 28 are disposed so as to be located in front of the right and left eyes of the user when the user wears the image display section 20. One end of the right optical image display unit 26 and one end of the left optical image display unit 28 are connected to each other at the position corresponding to the glabella of the user when the user wears the image display section 20.

The right holding unit 21 is a member which is provided so as to extend over a position corresponding to the temporal region of the user from an end part ER which is the other end of the right optical image display unit 26 when the user wears the image display section 20. Similarly, the left holding unit 23 is a member which is provided so as to extend over a position corresponding to the temporal region of the user from an end part EL which is the other end of the left optical image display unit 28 when the user wears the image display section 20. The right holding unit 21 and the left holding unit 23 hold the image display section 20 on the head of the user in the same manner as temples of spectacles.

The right display driving unit 22 and the left display driving unit 24 are disposed on a side opposing the head of the user when the user wears the image display section 20. Hereinafter, the right holding unit 21 and the left holding unit 23 are collectively simply referred to as "holding units", the right display driving unit 22 and the left display driving unit 24 are collectively simply referred to as "display driving units", and the right optical image display unit 26 and the left optical image display unit 28 are collectively simply referred to as "optical image display units".

The display driving units 22 and 24 respectively include liquid crystal displays 241 and 242 (hereinafter, referred to as an "LCDs 241 and 242"), projection optical systems 251 and 252, and the like (refer to FIG. 6). Details of configurations of the display driving units 22 and 24 will be described later. The optical image display units 26 and 28 as optical members include light guide plates 261 and 262 (refer to FIG. 6) and dimming plates. The light guide plates 261 and 262 are made of light transmissive resin material or the like and guide image light which is output from the display driving units 22 and 24 to the eyes of the user. The dimming plate is a thin plate-shaped optical element, and is disposed to cover a surface side of the image display section 20 which is an opposite side to the user's eye side. The dimming plate protects the light guide plates 261 and 262 so as to prevent the light guide plates 261 and 262 from being damaged, polluted, or the like. In addition, light transmittance of the dimming plates is adjusted so as to adjust an amount of external light entering the eyes of the user, thereby controlling an extent of visually recognizing a virtual image. The dimming plate may be omitted.

The camera 60 images external scenery. The camera 60 is disposed at a position where one end of the right optical image display unit 26 and one end of the left optical image display unit 28 are connected to each other. As will be described later in detail, a pose of a target object included in the external scenery is estimated by using an image of the target object included in the external scenery imaged by the camera 60 and preferably a super-template stored in a storage unit 120. The camera 60 corresponds to an imaging section in the SUMMARY.

The image display section 20 further includes a connection unit 40 which connects the image display section 20 to the control section 10. The connection unit 40 includes a main body cord 48 connected to the control section 10, a right cord 42, a left cord 44, and a connection member 46. The right cord 42 and the left cord 44 are two cords into which the main body cord 48 branches out. The right cord 42 is inserted into a casing of the right holding unit 21 from an apex AP in the extending direction of the right holding unit 21, and is connected to the right display driving unit 22. Similarly, the left cord 44 is inserted into a casing of the left holding unit 23 from an apex AP in the extending direction of the left holding unit 23, and is connected to the left display driving unit 24. The connection member 46 is provided at a branch point of the main body cord 48, the right cord 42, and the left cord 44, and has a jack for connection of an earphone plug 30. A right earphone 32 and a left earphone 34 extend from the earphone plug 30.

The image display section 20 and the control section 10 transmit various signals via the connection unit 40. An end part of the main body cord 48 on an opposite side to the connection member 46, and the control section 10 are respectively provided with connectors (not illustrated) fitted to each other. The connector of the main body cord 48 and the connector of the control section 10 are fitted into or released from each other, and thus the control section 10 is connected to or disconnected from the image display section 20. For example, a metal cable or an optical fiber may be used as the right cord 42, the left cord 44, and the main body cord 48.

The control section 10 is a device used to control the HMD 100. The control section 10 includes a determination key 11, a lighting unit 12, a display changing key 13, a track pad 14, a luminance changing key 15, a direction key 16, a menu key 17, and a power switch 18. The determination key 11 detects a pushing operation, so as to output a signal for determining content operated in the control section 10. The lighting unit 12 indicates an operation state of the HMD 100 by using a light emitting state thereof. The operation state of the HMD 100 includes, for example, ON and OFF of power, or the like. For example, an LED is used as the lighting unit 12. The display changing key 13 detects a pushing operation so as to output a signal for changing a content moving image display mode between 3D and 2D. The track pad 14 detects an operation of the finger of the user on an operation surface of the track pad 14 so as to output a signal based on detected content. Various track pads of a capacitance type, a pressure detection type, and an optical type may be employed as the track pad 14. The luminance changing key 15 detects a pushing operation so as to output a signal for increasing or decreasing a luminance of the image display section 20. The direction key 16 detects a pushing operation on keys corresponding to vertical and horizontal directions so as to output a signal based on detected content. The power switch 18 detects a sliding operation of the switch so as to change a power supply state of the HMD 100.

Figure 6:
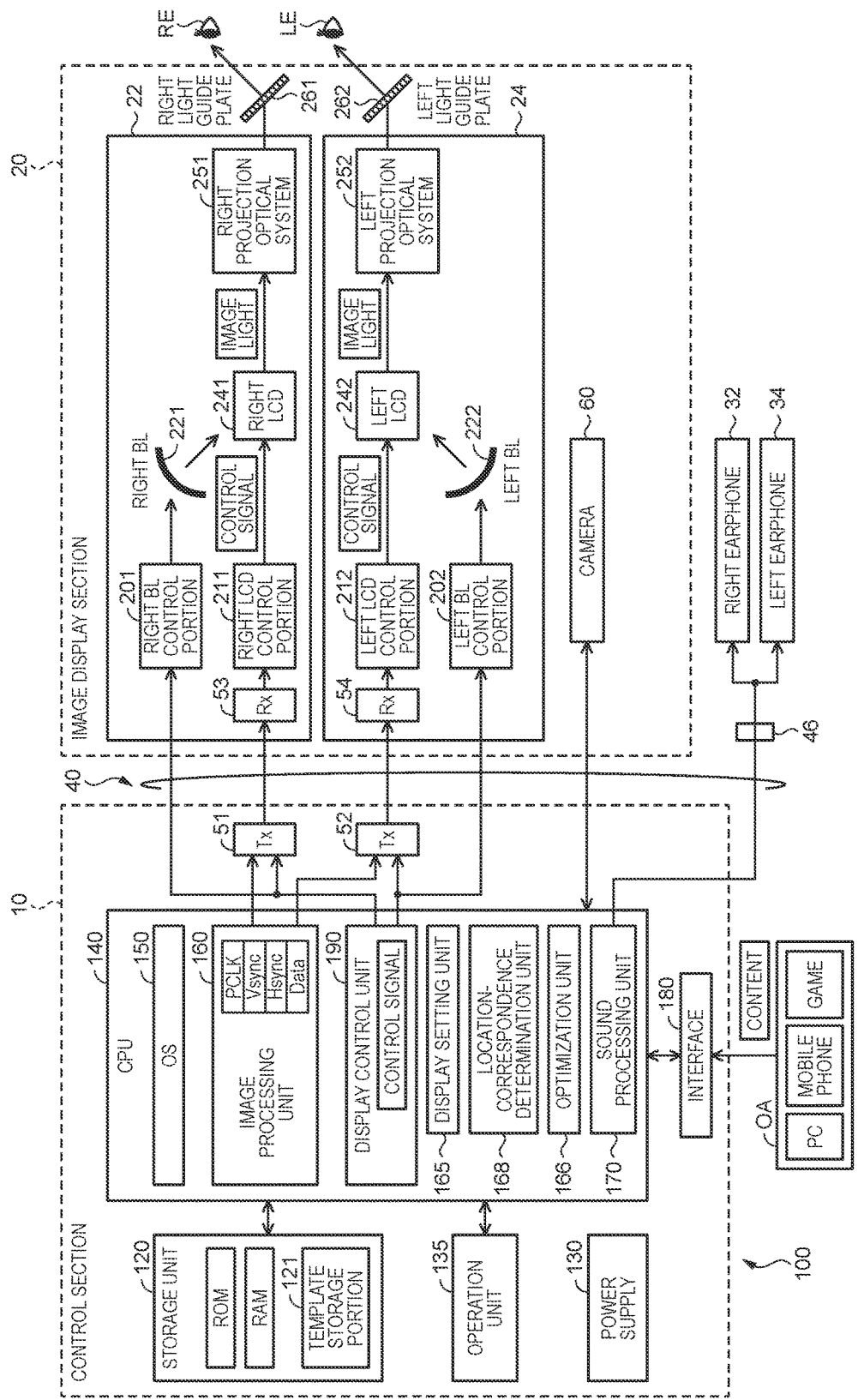
FIG. 6 is a block diagram functionally illustrating a configuration of the HMD in the present embodiment.

FIG. 6 is a functional block diagram illustrating a configuration of the HMD 100 of the present embodiment. As illustrated in FIG. 6, the control section 10 includes the storage unit 120, a power supply 130, an operation unit 135, a CPU 140, an interface 180, a transmission unit 51 (Tx 51), and a transmission unit 52 (Tx 52). The operation unit 135 is constituted of the determination key 11, the display changing key 13, the track pad 14, the luminance changing key 15, the direction key 16, and the menu key 17, and the power switch 18, which receive operations from the user. The power supply 130 supplies power to the respective units of the HMD 100. For example, a secondary battery may be used as the power supply 130.

The storage unit 120 includes a ROM storing a computer program, a RAM which is used for the CPU 140 to perform writing and reading of various computer programs, and a template storage portion 121. The template storage portion 121 stores a super-template created by the template creator 6 of the personal computer PC. The template storage portion 121 acquires the super-template via a USB memory connected to the interface 180. The template storage portion 121 corresponds to a template acquisition section in the appended claims.

The CPU 140 reads the computer programs stored in the ROM of the storage unit 120, and writes and reads the computer programs to and from the RAM of the storage unit 120, so as to function as an operating system 150 (OS 150), a display control unit 190, a sound processing unit 170, an image processing unit 160, an image setting unit 165, a location-correspondence determination unit 168, and an optimization unit 166.

The display control unit 190 generates control signals for control of the right display driving unit 22 and the left display driving unit 24. Specifically, the display control unit 190 individually controls the right LCD control portion 211 to turn on and off driving of the right LCD 241, controls the right backlight control portion 201 to turn on and off driving of the right backlight 221, controls the left LCD control portion 212 to turn on and off driving of the left LCD 242, and controls the left backlight control portion 202 to turn on and off driving of the left backlight 222, by using the control signals. Consequently, the display control unit 190 controls each of the right display driving unit 22 and the left display driving unit 24 to generate and emit image light. For example, the display control unit 190 causes both of the right display driving unit 22 and the left display driving unit 24 to generate image light, causes either of the two units to generate image light, or causes neither of the two units to generate image light. Generating image light is also referred to as "displaying an image".

The display control unit 190 transmits the control signals for the right LCD control portion 211 and the left LCD control portion 212 thereto via the transmission units 51 and 52. The display control unit 190 transmits control signals for the right backlight control portion 201 and the left backlight control portion 202 thereto.

The image processing unit 160 acquires an image signal included in content. The image processing unit 160 separates synchronization signals such as a vertical synchronization signal VSync and a horizontal synchronization signal HSync from the acquired image signal. The image processing unit 160 generates a clock signal PCLK by using a phase locked loop (PLL) circuit or the like (not illustrated) on the basis of a cycle of the separated vertical synchronization signal VSync or horizontal synchronization signal HSync. The image processing unit 160 converts an analog image signal from which the synchronization signals are separated into a digital image signal by using an A/D conversion circuit or the like (not illustrated). Next, the image processing unit 160 stores the converted digital image signal in a DRAM of the storage unit 120 for each frame as image data (RGB data) of a target image. The image processing unit 160 may perform, on the image data, image processes including a resolution conversion process, various color tone correction processes such as adjustment of luminance and color saturation, a keystone correction process, and the like, as necessary.

The image processing unit 160 transmits each of the generated clock signal PCLK, vertical synchronization signal VSync and horizontal synchronization signal HSync, and the image data stored in the DRAM of the storage unit 120, via the transmission units 51 and 52. Here, the image data which is transmitted via the transmission unit 51 is referred to as "right eye image data", and the image data Data which is transmitted via the transmission unit 52 is referred to as "left eye image data". The transmission units 51 and 52 function as a transceiver for serial transmission between the control section 10 and the image display section 20.

The sound processing unit 170 acquires an audio signal included in the content so as to amplify the acquired audio signal, and supplies the amplified audio signal to a speaker (not illustrated) of the right earphone 32 connected to the connection member 46 and a speaker (not illustrated) of the left earphone 34 connected thereto. In addition, for example, in a case where a Dolby (registered trademark) system is employed, the audio signal is processed, and thus different sounds of which frequencies are changed are respectively output from the right earphone 32 and the left earphone 34.

In a case where an image of external scenery including a target object is captured by the camera 60, the location-correspondence determination unit 168 detects edges of the target object in the captured image. Then, the location-correspondence determination unit 168 determines correspondences between the edges (edge feature elements) of the target object and the contour feature elements of the 2D model stored in the template storage portion 121. In the present embodiment, a plurality of templates are created and stored in advance with a specific target object (for example, a specific part) as a preset target object. Therefore, if a preset target object is included in a captured image, the location-correspondence determination unit 168 determines correspondences between 2D locations of edges of the target object and 2D locations of 2D model points of the target object included in a template selected among from a plurality of the templates in different views. A specific process of determining or establishing the correspondences between the edge feature elements of the target object in the captured image and the contour feature elements of the 2D model in the template will be described later.

The optimization unit 166 outputs 3D model points, which include respective 3D locations, corresponding to 2D model points having the correspondences to the image points from the template of the target object, and minimizes a cost function in Equation (14) on the basis of the image points, the 3D model points, and the view represented by at least one transformation matrix, so as to estimate a location and a pose in the three dimensions of the target object included in the external scenery imaged by the camera 60. Estimation and/or optimization of a position and a pose of the imaged target object will be described later.

The image setting unit 165 performs various settings on an image (display image) displayed on the image display section 20. For example, the image setting unit 165 sets a display position of the display image, a size of the display image, luminance of the display image, and the like, or sets right eye image data and left eye image data so that binocular parallax (hereinafter, also referred to as "parallax") is formed in order for a user to stereoscopically (3D) visually recognize the display image as a three-dimensional image. The image setting unit 165 detects a determination target image set in advance from a captured image by applying pattern matching or the like to the captured image.

The image setting unit 165 displays (renders) a 3D model corresponding to the target object on the optical image display units 26 and 28 in a pose of target object which is derived and/or optimized by the optimization unit 166 in a case where the location-correspondence determination unit 168 and the optimization unit 166 are performing various processes and have performed the processes. The operation unit 135 receives an operation from the user, and the user can determine whether or not the estimated pose of the target object matches a pose of the target object included in the external scenery transmitted through the optical image display units 26 and 28.

The interface 180 is an interface which connects the control section 10 to various external apparatuses OA which are content supply sources. As the external apparatuses OA, for example, a personal computer (PC), a mobile phone terminal, and a gaming terminal may be used. As the interface 180, for example, a USB interface, a microUSB interface, and a memory card interface may be used.

The image display section 20 includes the right display driving unit 22, the left display driving unit 24, the right light guide plate 261 as the right optical image display unit 26, the left light guide plate 262 as the left optical image display unit 28, and the camera 60.

The right display driving unit 22 includes a reception portion 53 (Rx 53), the right backlight control portion 201 (right BL control portion 201) and the right backlight 221 (right BL 221) functioning as a light source, the right LCD control portion 211 and the right LCD 241 functioning as a display element, and a right projection optical system 251. As mentioned above, the right backlight control portion 201 and the right backlight 221 function as a light source. As mentioned above, the right LCD control portion 211 and the right LCD 241 function as a display element. The right backlight control portion 201, the right LCD control portion 211, the right backlight 221, and the right LCD 241 are collectively referred to as an "image light generation unit".

The reception portion 53 functions as a receiver for serial transmission between the control section 10 and the image display section 20. The right backlight control portion 201 drives the right backlight 221 on the basis of an input control signal. The right backlight 221 is a light emitting body such as an LED or an electroluminescent element (EL). The right LCD control portion 211 drives the right LCD 241 on the basis of the clock signal PCLK, the vertical synchronization signal VSync, the horizontal synchronization signal HSync, and the right eye image data which are input via the reception portion 53. The right LCD 241 is a transmissive liquid crystal panel in which a plurality of pixels are disposed in a matrix.

The right projection optical system 251 is constituted of a collimator lens which converts image light emitted from the right LCD 241 into parallel beams of light flux. The right light guide plate 261 as the right optical image display unit 26 reflects image light output from the right projection optical system 251 along a predetermined light path, so as to guide the image light to the right eye RE of the user. The right projection optical system 251 and the right light guide plate 261 are collectively referred to as a "light guide portion".

The left display driving unit 24 has the same configuration as that of the right display driving unit 22. The left display driving unit 24 includes a reception portion 54 (Rx 54), the left backlight control portion 202 (left BL control portion 202) and the left backlight 222 (left BL 222) functioning as a light source, the left LCD control portion 212 and the left LCD 242 functioning as a display element, and a left projection optical system 252. As mentioned above, the left backlight control portion 202 and the left backlight 222 function as a light source. As mentioned above, the left LCD control portion 212 and the left LCD 242 function as a display element. In addition, the left backlight control portion 202, the left LCD control portion 212, the left backlight 222, and the left LCD 242 are collectively referred to as an "image light generation unit". The left projection optical system 252 is constituted of a collimator lens which converts image light emitted from the left LCD 242 into parallel beams of light flux. The left light guide plate 262 as the left optical image display unit 28 reflects image light output from the left projection optical system 252 along a predetermined light path, so as to guide the image light to the left eye LE of the user. The left projection optical system 252 and the left light guide plate 262 are collectively referred to as a "light guide portion".

A-4. Execution (Run-time) of Estimation of Target Object Pose

Figure 7:
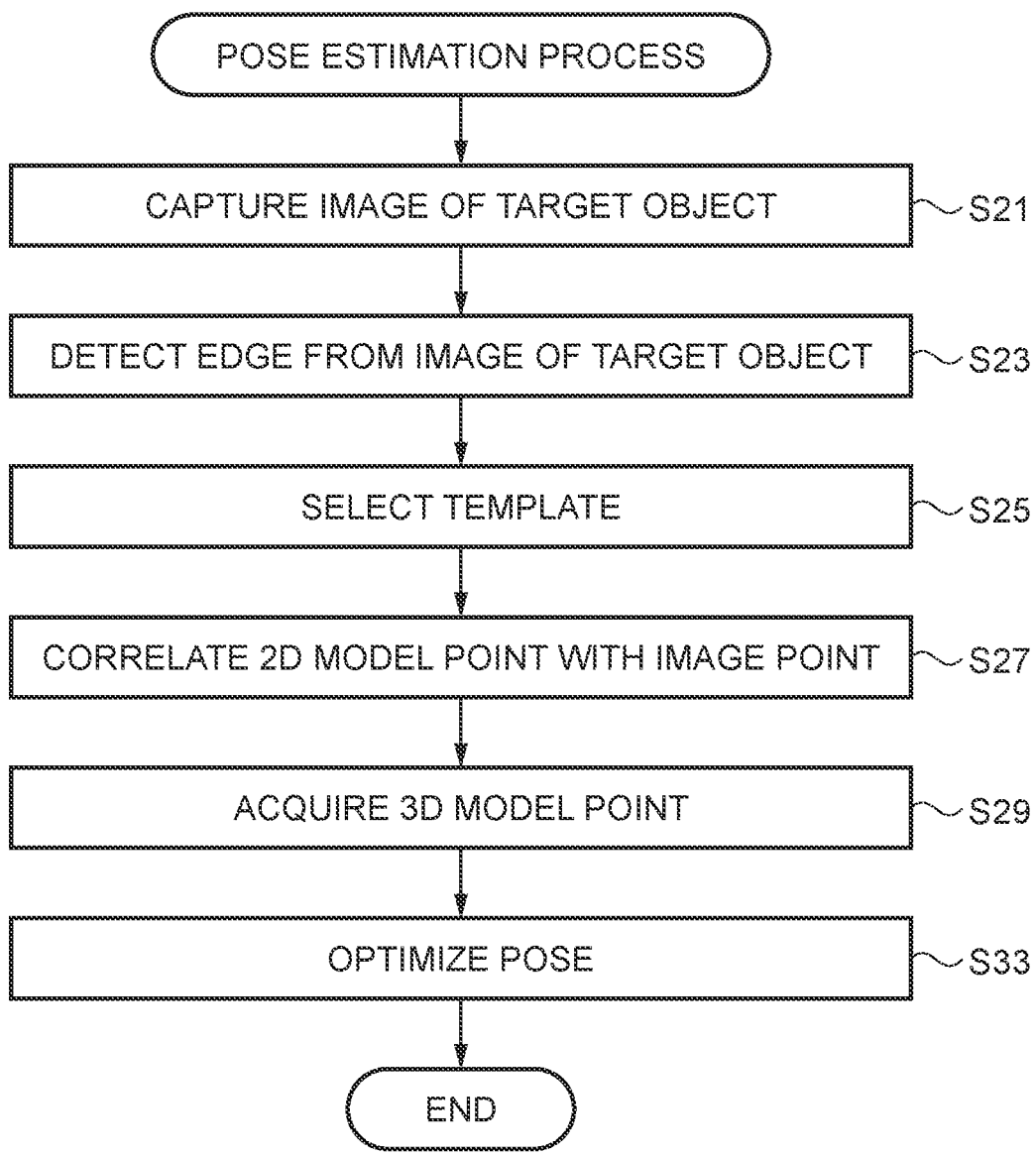
FIG. 7 is a flowchart illustrating a process of estimating a pose of a target object.

FIG. 7 is a flowchart illustrating a target object pose estimation process. In the pose estimation process, first, the location-correspondence determination unit 168 images external scenery including a target object with the camera 60 (step S21). The location-correspondence determination unit 168 performs edge detection described below on a captured image of the target object (step S23).

A-4-1. Edge Detection (Step S23)

The location-correspondence determination unit 168 detects an edge of the image of the target object in order to correlate the imaged target object with a template corresponding to the target object. The location-correspondence determination unit 168 computes features serving as the edge on the basis of pixels of the captured image. In the present embodiment, the location-correspondence determination unit 168 computes gradient of luminance of the pixels of the captured image of the target object so as to determine the features. When the edge is detected from the captured image, objects other than the target object in the external scenery, different shadows, different illumination, and different materials of objects included in the external scenery may influence the detected edge. Thus, it may be relatively difficult to detect the edge from the captured image may than to detect an edge from a 3D CAD model. In the present embodiment, in order to more easily detect an edge, the location-correspondence determination unit 168 only compares an edge with a threshold value and suppresses non-maxima, in the same manner as in procedures performed in a simple edge detection method.

A-4-2. Selection of Template (Step S25)

If the edge is detected from the image of the target object, the location-correspondence determination unit 168 selects a template having a view closest to the pose of the target object in a captured image thereof from among templates stored in the template storage portion 121 (step S25). For this selection, an existing three-dimensional pose estimation algorithm for estimating a rough pose of a target object may be used separately. The location-correspondence determination unit 168 may find a new training view closer to the pose of the target object in the image than the selected training view when highly accurately deriving a 3D pose. In a case of finding a new training view, the location-correspondence determination unit 168 highly accurately derives a 3D pose in the new training view. In the present embodiment, if views are different from each other, contour features as a set of visually recognizable edges including the 2D outline of the 3D model are also different from each other, and thus a new training view may be found. The location-correspondence determination unit 168 uses a super-template for a problem that sets of visually recognizable edges are different from each other, and thus extracts as many visually recognizable edges as possible. In another embodiment, instead of using a template created in advance, the location-correspondence determination unit 168 may image a target object, and may create a template by using 3D CAD data while reflecting an imaging environment such as illumination in rendering on the fly and as necessary, so as to extract as many visually recognizable edges as possible.

A-4-3. 2D Point Correspondences (Step S27)

If the process in step S25 is completed, the location-correspondence determination unit 168 correlates the edge of the image of the target object with 2D model points included in the template (step S27).

Figure 8:
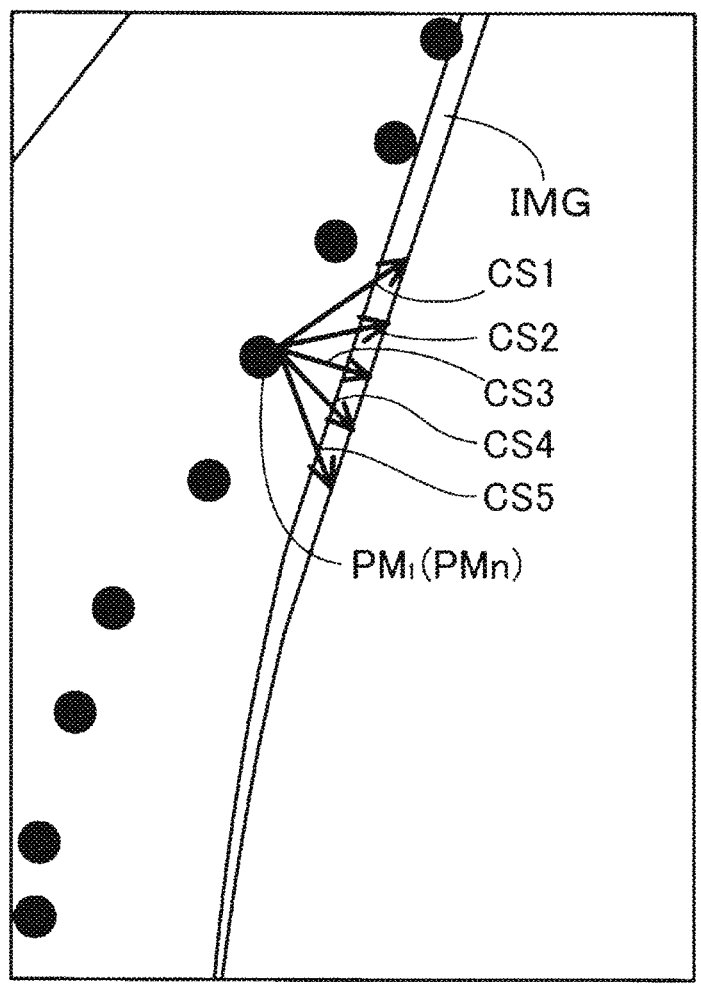
FIG. 8 is a diagram illustrating that a single model point can be combined with a plurality of image points.
Figure 9:
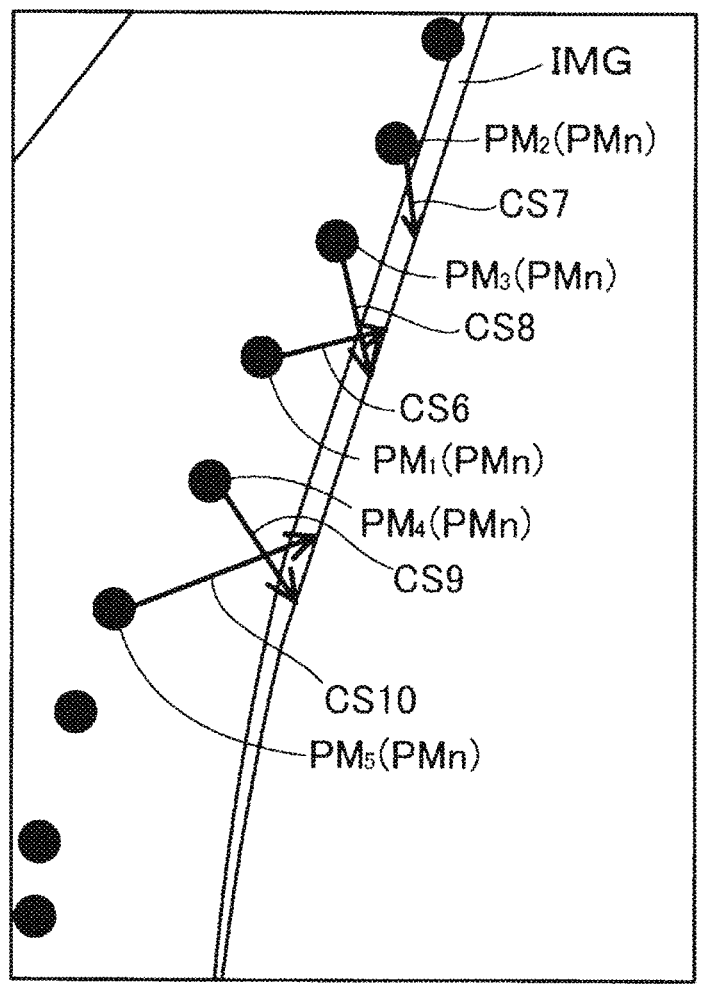
FIG. 9 is a diagram illustrating an example in which a model point is combined with wrong image points.

FIG. 8 is a diagram illustrating that a single 2D model point is combined with a plurality of image points included in a certain edge. FIG. 9 is a diagram illustrating an example in which a 2D model point is combined with wrong image points. FIGS. 8 and 9 illustrate a captured image IMG of the target object OBm, a partial enlarged view of the 2D model point set PMn, and a plurality of arrows CS in a case where the target object OBm corresponding to the 3D model illustrated in FIG. 3 is imaged by the camera 60. As illustrated in FIG. 8, a portion of an edge detected from the image IMG of the target object OBm which is correlated with a 2D model point $PM_1$ which is one of the 2D model points included in a template includes a plurality of options as in the arrows CS1 to CS5. FIG. 9 illustrates an example in which 2D model points $PM_1$ to $PM_5$ included in the template and arranged are wrongly combined with an edge (image points included therein) detected from the image IMG of the target object OBm. In this case, for example, in FIG. 9, despite the 2D model points $PM_2$, $PM_3$, $PM_1$, $PM_4$ and $PM_5$ being arranged from the top, the arrows CS7, CS6, CS8, CS10 and CS9 are arranged in this order in the edge of the image IMG of the target object OBm. Thus, the arrow CS8 and the arrow CS6, and the arrow CS9 and the arrow CS10 are changed. As described above, the location-correspondence determination unit 168 is required to accurately correlate 2D model points included in a template with image points included in an edge of the image IMG of the target object OBm to accurately estimate or derive a pose of the imaged target object OBm.

In the present embodiment, the location-correspondence determination unit 168 computes similarity scores by using the following Equation (11) with respect to all image points included in a local vicinity of each projected 2D model point.

$$SIM(p, p') = \left| \vec{E_p} \cdot \vec{\nabla}_{p'} \right| / \left| \max_{q \in N(p)} \| \vec{\nabla} I_p \| \right| \tag{11}$$

The measure of similarity scores indicated in Equation (11) is based on matching between a gradient vector (hereinafter, simply referred to as gradient) of luminance of a 2D model point included in a template and a gradient vector of an image point, but is based on an inner product of the two vectors in Equation (11) as an example. The vector of Ep in Equation (11) is a unit length gradient vector of a 2D model point (edge point) p. The location-correspondence determination unit 168 uses gradient ∇I of a test image (input image) in order to compute features of an image point p' when obtaining the similarity scores. The normalization by the local maximum of the gradient magnitude in the denominator in Expression (11) ensures that the priority is reliably given to an edge with a locally high intensity. This normalization prevents an edge which is weak and thus becomes noise from being collated. The location-correspondence determination unit 168 enhances a size N(p) of a nearest neighborhood region in which a correspondence is searched for when the similarity scores are obtained. For example, in a case where an average of position displacement of a projected 2D model point is reduced in consecutive iterative computations, N(p) may be reduced. Hereinafter, a specific method for establishing correspondences using Equation (11) will be described.

Figure 10:
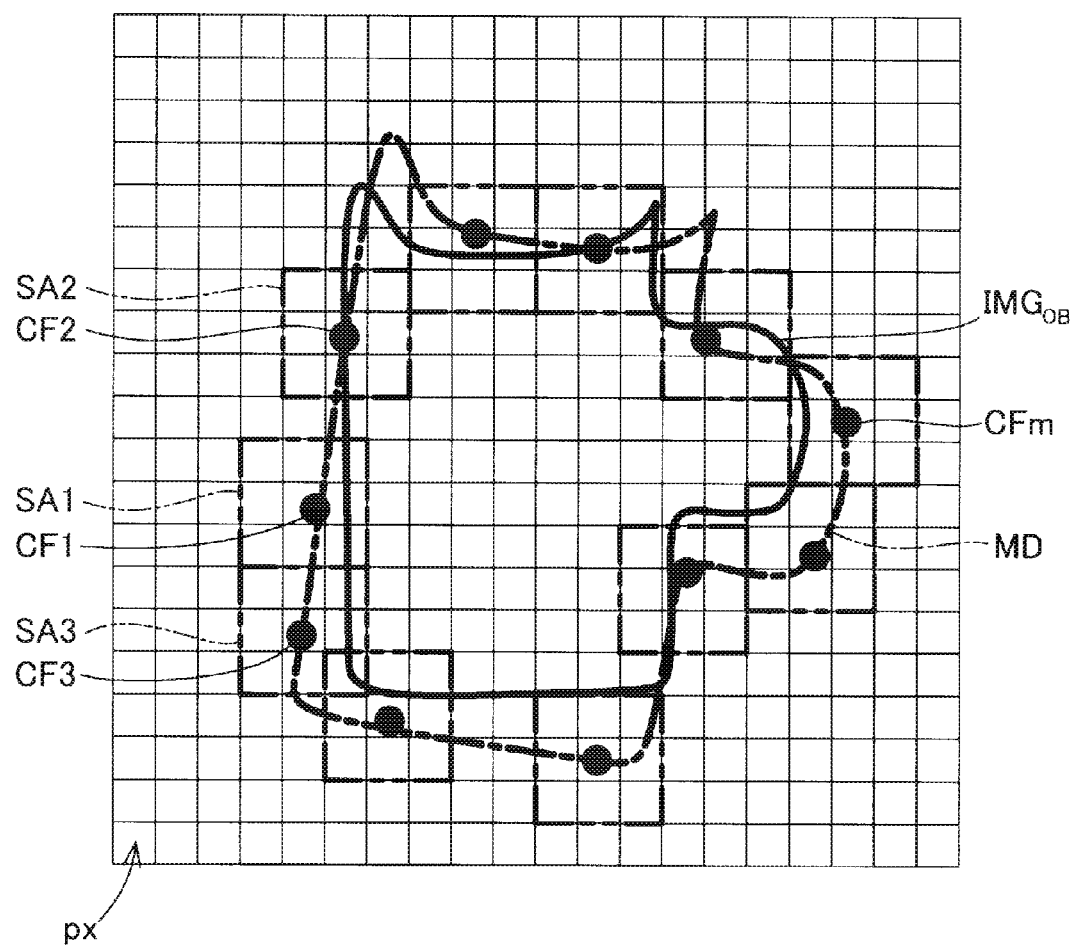
FIG. 10 is a diagram illustrating an example of computation of CF similarity.
Figure 11:
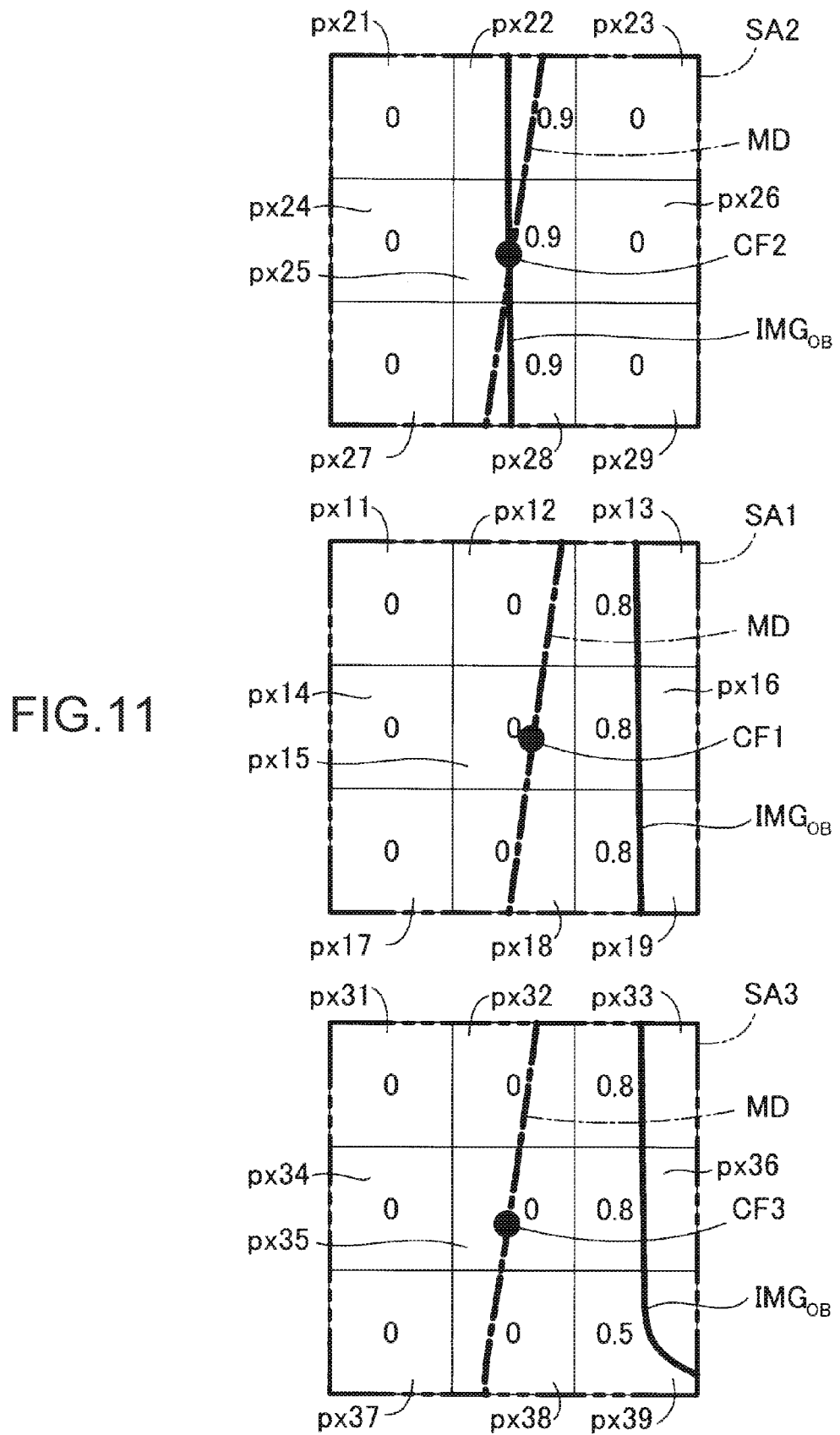
FIG. 11 is a diagram illustrating an example of computation of CF similarity.
Figure 12:
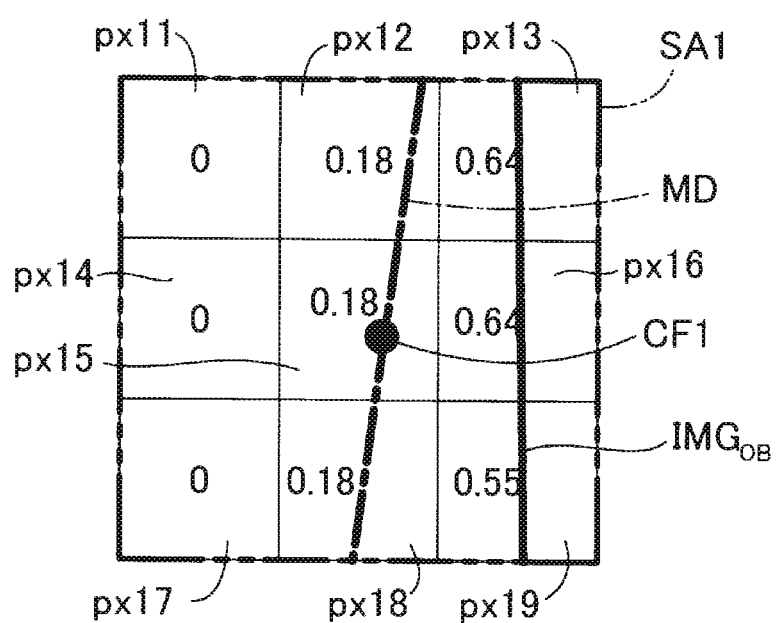
FIG. 12 is a diagram illustrating an example of computation of CF similarity.

FIGS. 10 to 12 are diagrams illustrating an example of computation of similarity scores. FIG. 10 illustrates an image $IMG_{OB}$ (solid line) of a target object captured by the camera 60, a 2D model MD (dot chain line) based on a template similar to the image $IMG_{OB}$ of the target object, and 2D model points as a plurality of contour features CFm in the 2D model MD. FIG. 10 illustrates a plurality of pixels px arranged in a lattice form, and a region (for example, a region SA1) formed of 3 pixels×3 pixels centering on each of the contour features CFm. FIG. 10 illustrates the region SA1 centering on the contour feature CF1 which will be described later, a region SA2 centering on a contour feature CF2, and a region SA3 centering on a contour feature CF3. The contour feature CF1 and the contour feature CF2 are adjacent to each other, and the contour feature CF1 and the contour feature CF3 are also adjacent to each other. In other words, the contour features are arranged in order of the contour feature CF2, the contour feature CF1, and the contour feature CF3 in FIG. 10.

As illustrated in FIG. 10, since the image $IMG_{OB}$ of the target object does not match the 2D model MD, the location-correspondence determination unit 168 correlates image points included in an edge of the image $IMG_{OB}$ of the target object with 2D model points represented by the plurality of contour features CFm of the 2D model MD, respectively, by using Equation (11). First, the location-correspondence determination unit 168 selects the contour feature CF1 as one of the plurality of contour features CFm, and extracts the region SA1 of 3 pixels×3 pixels centering on a pixel px including the contour feature CF1. Next, the location-correspondence determination unit 168 extracts the region SA2 and the region SA3 of 3 pixels×3 pixels respectively centering on the two contour features such as the contour feature CF2 and the contour feature CF3 which are adjacent to the contour feature CF1. The location-correspondence determination unit 168 calculates a score by using Equation (11) for each pixel px forming each of the regions SA1, SA2 and SA3. In this stage, the regions SA1, SA2 and SA3 are matrices having the same shape and the same size.

FIG. 11 illustrates enlarged views of the respective regions SA1, SA2 and SA3, and similarity scores calculated for the respective pixels forming the regions SA1, SA2 and SA3. The location-correspondence determination unit 168 calculates similarity scores between the 2D model point as the contour feature and the nine image points. For example, in the region SA3 illustrated on the lower part of FIG. 11, the location-correspondence determination unit 168 calculates, as scores, 0.8 for pixels px33 and px36, 0.5 for a pixel px39, and 0 for the remaining six pixels. The reason why the score of 0.8 for the pixels px33 and px36 is different from the score of 0.5 for the pixel px39 is that the image $IMG_{OB}$ of the target object in the pixel px39 is bent and thus gradient differs. As described above, the location-correspondence determination unit 168 calculates similarity scores of each pixel (image point) forming the extracted regions SA1, SA2 and SA3 in the same manner.

Hereinafter, a description will be made focusing on the contour feature CF1. The location-correspondence determination unit 168 calculates a corrected score of each pixel forming the region SA1. Specifically, the similarity scores are averaged with weighting factors by using pixels located at the same matrix positions of the regions SA2 and SA3 as the respective pixels forming the region SA1. The location-correspondence determination unit 168 performs this correction of the similarity scores not only on the contour feature CF1 but also on the other contour features CF2 and CF3. In the above-described way, it is possible to achieve an effect in which a correspondence between a 2D model point and an image point is smoothed. In the example illustrated in FIG. 11, the location-correspondence determination unit 168 calculates corrected scores by setting a weighting factor of a score of each pixel px of the region SA1 to 0.5, setting a weighting factor of a score of each pixel px of the region SA2 to 0.2, and setting a weighting factor of a score of each pixel px of the region SA3 to 0.3. For example, 0.55 as a corrected score of the pixel px19 illustrated in FIG. 12 is a value obtained by adding together three values such as a value obtained by multiplying the score of 0.8 for the pixel px19 of the region SA1 by the weighting factor of 0.5, a value obtained by multiplying the score of 0 for the pixel px29 of the region SA2 by the weighting factor of 0.2, and a value obtained by multiplying the score of 0.5 for the pixel px39 of the region SA3 by the weighting factor of 0.3. The weighting factors are inversely proportional to distances between the processing target contour feature CF1 and the other contour features CF2 and CF3. The location-correspondence determination unit 168 determines an image point having the maximum score among the corrected scores of the pixels forming the region SA1, as an image point correlated with the contour feature CF1. In the example illustrated in FIG. 12, the maximum value of the corrected scores is 0.64 of the pixels px13 and px16. In a case where a plurality of pixels have the same corrected score, the location-correspondence determination unit 168 selects the pixel px16 whose distance from the contour feature CF1 is shortest, and the location-correspondence determination unit 168 correlates the contour feature CF1 with an image point of the pixel px16. The location-correspondence determination unit 168 compares edges detected in a plurality of images of the target object captured by the camera 60 with 2D model points in a template in a view close to the images of the target object, so as to determine image points of the target object corresponding to the 2D model points (contour features CF).

If the location-correspondence determination unit 168 completes the process in step S27 in FIG. 7, the optimization unit 166 acquires 3D model points corresponding to the 2D model points correlated with the image points and information regarding the view which is used for creating the 2D model points, from the template of the target object stored in the template storage portion 121 (step S29). The optimization unit 166 derives a pose of the target object imaged by the camera 60 on the basis of the extracted 3D model points and information regarding the view, and the image points (step S33). Details of the derivation are as follows.

A-4-4. Optimization of Pose (Step S33)

In the present embodiment, the optimization unit 166 highly accurately derives or refines a 3D pose of the target object by using contour features included in a template corresponding to a selected training view, and 3D model points corresponding to 2D model points included in the contour features. In the derivation, the optimization unit 166 derives a pose of the target object by performing optimization computation for minimizing Equation (14).

If the location-correspondence determination unit 168 completes establishing the correspondences between 2D model points and the image points in a predetermined view, the location-correspondence determination unit 168 reads 3D model points $P_i$ corresponding to the 2D model points (or the contour features $CF_i$) from a template corresponding to the view. In the present embodiment, as described above, the 3D model points $P_i$ corresponding to the 2D model points are stored in the template. However, the 3D model points $P_i$ are not necessarily stored in the template, and the location-correspondence determination unit 168 may inversely convert the 2D model points whose correspondences to the image points is completed, every time on the basis of the view, so as to obtain the 3D model points $P_i$.

The optimization unit 166 reprojects locations of the obtained 3D model points $P_i$ onto a 2D virtual plane on the basis of Equation (12).

$$\pi(P_i)=(u_i,v_i)^T \quad (12)$$

Here, $\pi$ in Equation (12) includes a rigid body transformation matrix and a perspective projecting transformation matrix included in the view. In the present embodiment, three parameters indicating three rotations about three axes included in the rigid body transformation matrix and three parameters indicating three translations along the three axes are treated as variables for minimizing Equation (14). The rotation may be represented by a quaternion. The image points $p_i$ corresponding to the 3D model points $P_i$ are expressed as in Equation (13).

$$p_i=(p_{ix},p_{iy})^T \quad (13)$$

The optimization unit 166 derives a 3D pose by using the cost function expressed by the following Equation (14) in order to minimize errors between the 3D model points $P_i$ and the image points $p_i$.

$$E_{match} = \sum_{i=1}^{N} w_i * \| \pi(P_i) - p_i \| = \sum_{i=1}^{N} w_i * ((u_i - p_{ix})^2 + (v_i - p_{iy})^2) \quad (14)$$

Here, $w_i$ in Equation (14) is a weighting factor for controlling the contribution of each model point to the cost function. A point which is projected onto the outside of an image boundary or a point having low reliability of the correspondence is given a weighting factor of a small value. In the present embodiment, in order to present specific adjustment of a 3D pose, the optimization unit 166 determines minimization of the cost function expressed by Equation (14) as a function of 3D pose parameters using the Gauss-Newton method, if one of the following three items is reached:

1. An initial 3D pose diverges much more than a preset pose. In this case, it is determined that minimization of the cost function fails.
2. The number of times of approximation using the Gauss-Newton method exceeds a defined number of times set in advance.
3. A relative pose change in the Gauss-Newton method is equal to or less than a preset threshold value. In this case, it is determined that the cost function is minimized.

When a 3D pose is derived, the optimization unit 166 may attenuate refinement of a pose of the target object. Time required to process estimation of a pose of the target object directly depends on the number of iterative computations which are performed so as to achieve high accuracy (refinement) of the pose. From a viewpoint of enhancing the system speed, it may be beneficial to employ an approach that derives a pose through as small a number of iterative computations as possible without compromising the accuracy of the pose. According to the present embodiment, each iterative computation is performed independently from its previous iterative computation, and thus no constraint is imposed, the constraint ensuring that the correspondences of 2D model points are kept consistent, or that the same 2D model points are correlated with the same image structure or image points between two consecutive iterative computations. As a result, particularly, in a case where there is a noise edge structure caused by a messy state in which other objects which are different from a target object are mixed in an image captured by the camera 60 or a state in which shadows are present, correspondences of points are unstable. As a result, more iterative computations may be required for convergence. According to the method of the present embodiment, this problem can be handled by multiplying the similarity scores in Equation (11) by an attenuation weighting factor shown in the following Equation (15).

$$w(\vec{\Delta p}) = e^{-(\frac{1}{\|\Delta p\|^2})/\sigma^2} \tag{15}$$

Equation (15) expresses a Gaussian function, and σ has a function of controlling the strength (effect) of attenuation. In a case where a value of σ is great, attenuation does not greatly occur, but in a case where a value of σ is small, strong attenuation occurs, and thus it is possible to prevent a point from becoming distant from the present location. In order to ensure consistency in correspondences of points in different iterative computations, in the present embodiment, σ is a function of a reprojecting error obtained through the latest several iterative computations. In a case where a reprojecting error (which may be expressed by Equation (14)) is considerable, in the method of the present embodiment, convergence does not occur. In an algorithm according to the present embodiment, σ is set to a great value, and thus a correspondence with a distant point is ensured so that attenuation is not almost or greatly performed. In a case where a reprojecting error is slight, there is a high probability that a computation state using the algorithm according to the present embodiment may lead to an accurate solution. Therefore, the optimization unit 166 sets σ to a small value so as to increase attenuation, thereby stabilizing the correspondences of points.

A-4-5. Subpixel Correspondences

The correspondences of points of the present embodiment takes into consideration only an image point at a pixel location of an integer, and thus there is a probability that accuracy of a 3D pose may be deteriorated. A method according to the present embodiment includes two techniques in order to cope with this problem. First, an image point p' whose similarity score is the maximum is found, and then the accuracy at this location is increased through interpolation. A final location is represented by a weighted linear combination of four connected adjacent image points p'. The weight here is a similarity score. Second, the method according to the present embodiment uses two threshold values for a reprojecting error in order to make a pose converge with high accuracy. In a case where great threshold values are achieved, a pose converges with high accuracy, and thus a slightly highly accurate solution has only to be obtained. Therefore, the length of vectors for the correspondences of points is artificially reduced to ½ through respective iterative computations after the threshold values are achieved. In this process, subsequent several computations are iteratively performed until the reprojecting error is less than a smaller second threshold value.

As a final step of deriving a pose with high accuracy, the location-correspondence determination unit 168 computes matching scores which is to be used to remove a wrong result. These scores have the same form as that of the cost function in Equation (14), and are expressed by the following Equation (16).

$$S_{match} = \frac{1}{N}\sum_{i=1}^{N} SIM_i \cdot e^{-\|\pi(P_i)-p_i\|/\sigma_2} \tag{16}$$

In Equation (16), $SIM_i$ indicates a similarity score between a contour feature i (a 2D model point) and an image point which most match the contour feature. The exponential part is a norm (the square of a distance between two points in the present embodiment) between the 2D model point reprojected by using the pose and the image point corresponding thereto, and N indicates the number of sets of the 2D model points and the image points. The optimization unit 166 continuously performs optimization in a case where a value of Equation (16) is smaller than a threshold value without employing the pose, and employs the pose in a case where the value of Equation (16) is equal to or greater than the threshold value. As described above, if the optimization unit 166 completes the process in step S33 in FIG. 7, the location-correspondence determination unit 168 and the optimization unit 166 finishes the pose estimation process.

As described above, in the HMD 100 of the present embodiment, the location-correspondence determination unit 168 detects an edge from an image of a target object captured by the camera 60. The location-correspondence determination unit 168 establishes the correspondences between the image points included in an image and the 2D model points included in a template stored in the template storage portion 121. The optimization unit 166 estimates or derives a pose of the imaged target object by using the 2D model points and 3D points obtained by converting the 2D model points included in the template. Specifically, the optimization unit 166 optimizes a pose of the imaged target object by using the cost function. Thus, in the HMD 100 of the present embodiment, if an edge representing a contour of the target object imaged by the camera 60 can be detected, a pose of the imaged target object can be estimated with high accuracy. Since the pose of the target object is estimated with high accuracy, the accuracy of overlapping display of an AR image on the target object is improved, and the accuracy of an operation performed by a robot is improved.

B. Comparative Example

A description will be made of a method (hereinafter, simply referred to as an "MA method") according to a comparative example which is different from the method (hereinafter, simply referred to as the "CF method") of the pose estimation process performed by the HMD 100 of the first embodiment. The MA method of the comparative example is a method of estimating a pose of a target object imaged by the camera 60 on the basis of two colors of a model, that is, a certain color of the target object and another color of a background which is different from the target object. In the MA method, a 3D pose of the target object is brought into matching by minimizing a cost function based on the two-color model.

Figure 13:
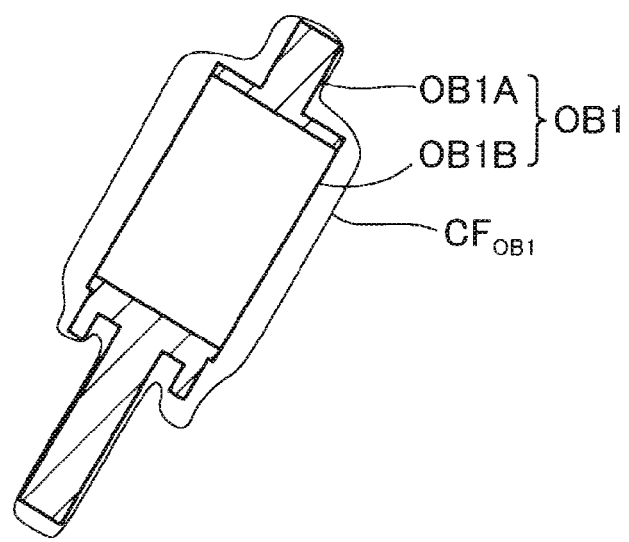
FIG. 13 is a diagram illustrating a result of estimating a pose of an imaged target object according to a CF method.
Figure 14:
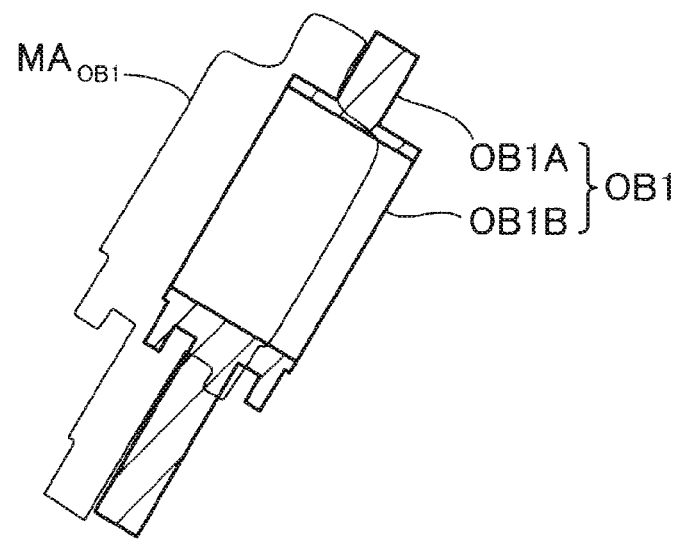
FIG. 14 is a diagram illustrating a result of estimating a pose of an imaged target object according to an MA method.

FIG. 13 is a diagram illustrating a result of estimating a pose of an imaged target object OB1 according to the CF method. FIG. 14 is a diagram illustrating a result of estimating a pose of an imaged target object OB1 according to the MA method. The target object OB1 illustrated in FIGS. 13 and 14 is imaged by the camera 60. The target object OB1 has a first portion OB1A (hatched portion) with a color which is different from a background color, and a second portion OB1B with the same color as the background color. A CF contour $CF_{OB1}$ is a contour of a pose of the target object OB1 estimated by the location-correspondence determination unit 168 and the optimization unit 166. As illustrated in FIG. 13, in pose estimation using the CF method, the CF contour $CF_{OB1}$ is similar to the contour of the target object OB1. On the other hand, as illustrated in FIG. 14, in pose estimation using the MA method, an MA contour $MA_{OB1}$ is deviated to the left side relative to the contour of the target object OB1. In the CF method, unlike the MA method, highly accurate pose estimation is performed on the second portion OB1B with the same color as the background color.

Figure 15:
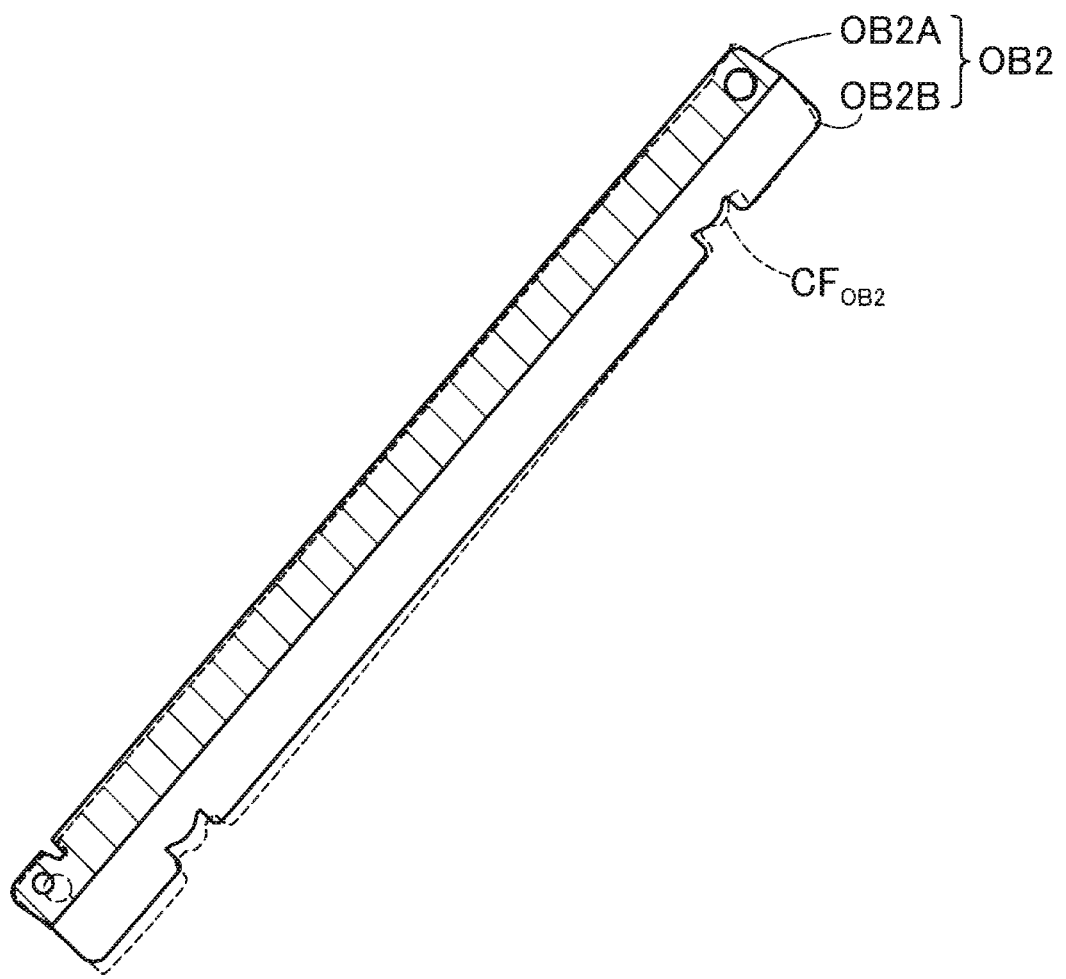
FIG. 15 is a diagram illustrating a result of estimating a pose of an imaged target object according to the CF method.
Figure 16:
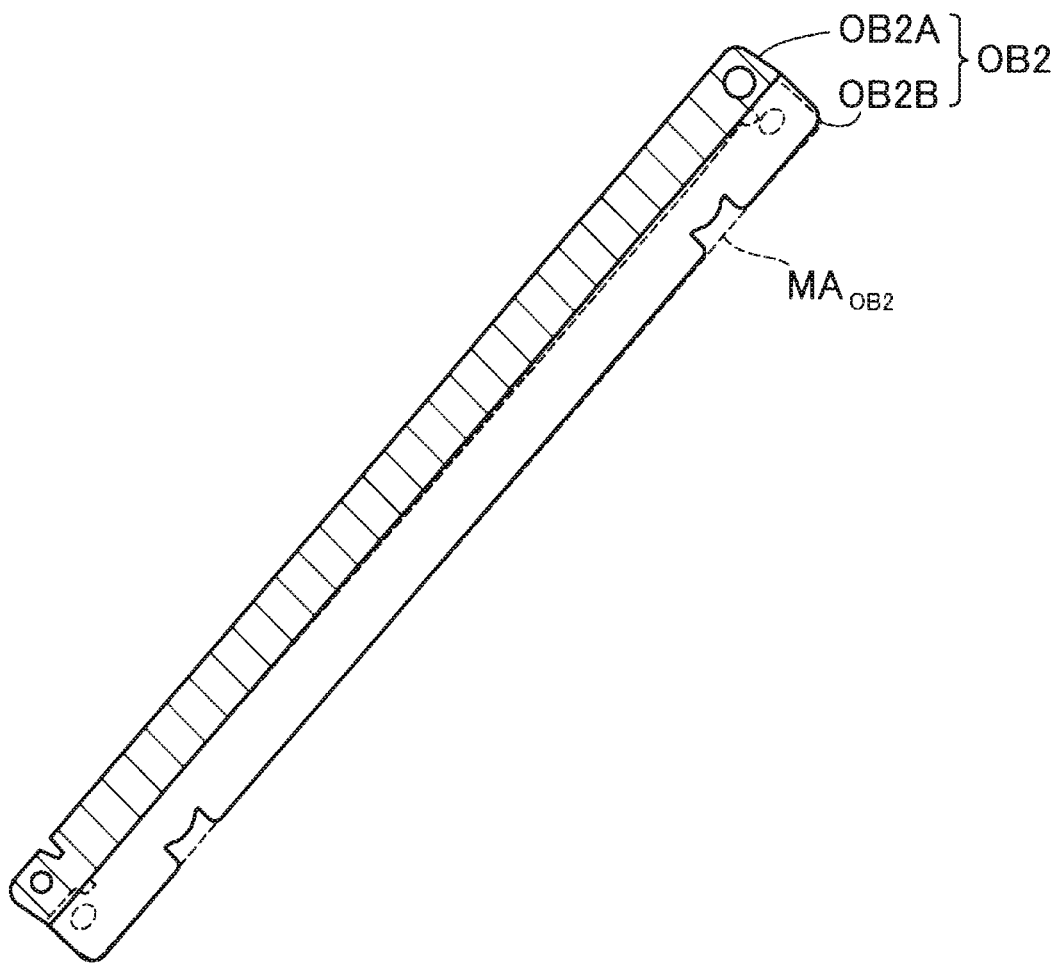
FIG. 16 is a diagram illustrating a result of estimating a pose of an imaged target object according to the MA method.

FIG. 15 is a diagram illustrating a result of estimating a pose of an imaged target object OB2 according to the CF method. FIG. 16 is a diagram illustrating a result of estimating a pose of an imaged target object OB2 according to the MA method. A color of the target object OB2 illustrated in FIGS. 15 and 16 is different from a background color. However, a first portion OB2A (hatched portion) included in the target object OB2 is shaded by influence of a second portion OB2B included in the target object OB2, and is thus imaged in a color similar to the background color by the camera 60. As illustrated in FIG. 15, in pose estimation using the CF method, a CF contour $CF_{OB2}$ (dashed line) is similar to the contour of the target object OB2. As illustrated in FIG. 16, in pose estimation using the MA method, the first portion OB2A cannot be detected, and thus an MA contour $M_{OB2}$ (dashed line) is similar to only the contour of the second portion OB2B. In the CF method, unlike the MA method, even if a shade is present in an image of the target object OB2, the first portion OB2A is accurately detected, and thus a pose of the target object OB2 is estimated with high accuracy.

Figure 17:
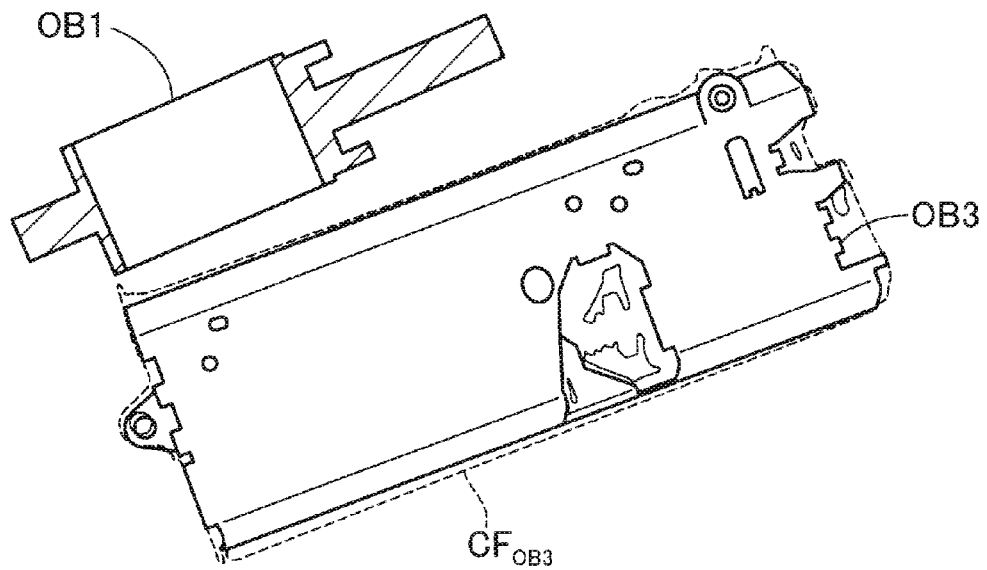
FIG. 17 is a diagram illustrating a result of estimating a pose of an imaged target object according to the CF method.
Figure 18:
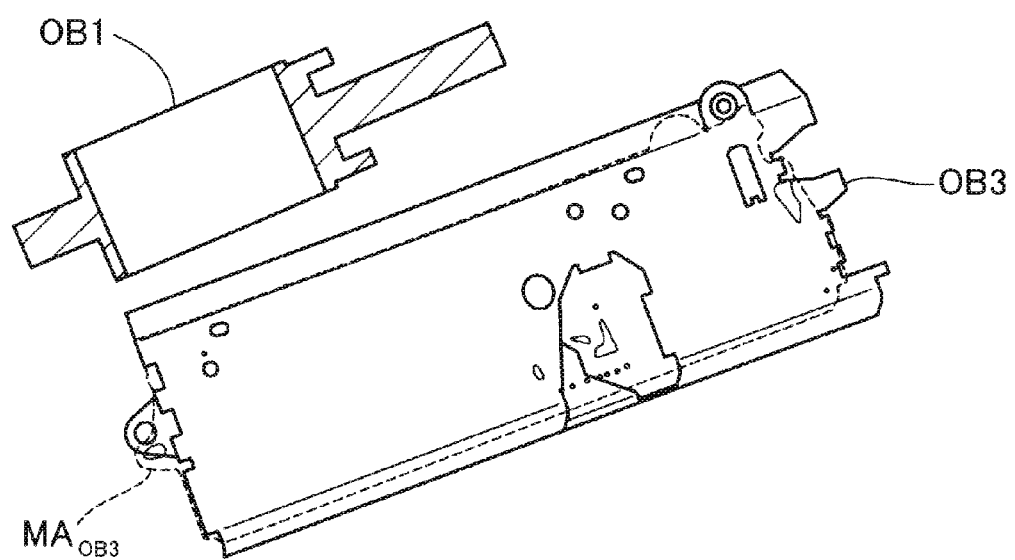
FIG. 18 is a diagram illustrating a result of estimating a pose of an imaged target object according to the MA method.

FIG. 17 is a diagram illustrating a result of estimating a pose of an imaged target object OB3 according to the CF method. FIG. 18 is a diagram illustrating a result of estimating a pose of an imaged target object OB3 according to the MA method. In the examples illustrated in FIGS. 17 and 18, a region imaged by the camera 60 includes a target object OB1 on which pose estimation is not required to be performed in addition to the target object OB3 whose pose is desired to be estimated. A color of the target object OB3 is different from a background color. As illustrated in FIG. 17, in pose estimation using the CF method, a CF contour $C_{OB3}$ is similar to an outer line of a captured image of the target object OB3. On the other hand, as illustrated in FIG. 18, in pose estimation using the MA method, an MA contour $M_{OB3}$ has a portion which does not match the contour of the imaged target object OB3 on an upper right side thereof. In the CF method, unlike the MA method, even if objects other than the target object OB3 on which pose estimation is performed are present in a region imaged by the camera 60, a pose of the target object OB3 is estimated with high accuracy.

As described above, in the HMD 100 of the present embodiment, in a case where a target object whose pose is desired to be estimated is imaged by the camera 60, the location-correspondence determination unit 168 and the optimization unit 166 can perform pose estimation of the target object with high accuracy even if a color of the target object is the same as a background color. Even if an imaged target object is shaded due to a shadow, the location-correspondence determination unit 168 and the optimization unit 166 can perform pose estimation of the target object with high accuracy. The location-correspondence determination unit 168 and the optimization unit 166 can perform pose estimation of the target object with high accuracy even if objects other than a target object are present in a region imaged by the camera 60.

In the personal computer PC of the present embodiment, the template creator 6 creates a super-template in which a plurality of different templates are correlated with each view. Thus, the location-correspondence determination unit 168 of the HMD 100 of the present embodiment can select a template including model points closest to a pose of a target object imaged by the camera 60 by using the super-template. Consequently, the optimization unit 166 can estimate a pose of the imaged target object within a shorter period of time and with high accuracy.

When compared with the MA method, the CF method can achieve a considerable improvement effect in a case of FIG. 14 in which the MA method does not completely work. In this case, the optimization unit 166 can cause optimization of a pose of the target object OB1 to converge. This is because the CF method depends on performance of reliably detecting sufficient edges of a target object. Even in a case where the two-color base collapses to a small degree in the MA method, there is a high probability that a better result than in the MA method may be obtained in the CF method.

Regarding computation time required to estimate a pose of an imaged target object, in the CF method, even if a plurality of 3D poses are given as inputs, a contour feature may be computed only once. On the other hand, in the MA method, more iterative computations are required in order to cause each input pose to converge. These iterative computations require a computation amount which cannot be ignored, and thus a plurality of input poses are processed in the CF method at a higher speed than in the MA method.

C. Second Embodiment

A second embodiment is the same as the first embodiment except for a computation method of similarity scores in establishing the correspondences of 2D points performed by the location-correspondence determination unit 168 of the HMD 100. Therefore, in the second embodiment, computation of similarity scores, which is different from the first embodiment, will be described, and description of other processes will be omitted.

Figure 19:
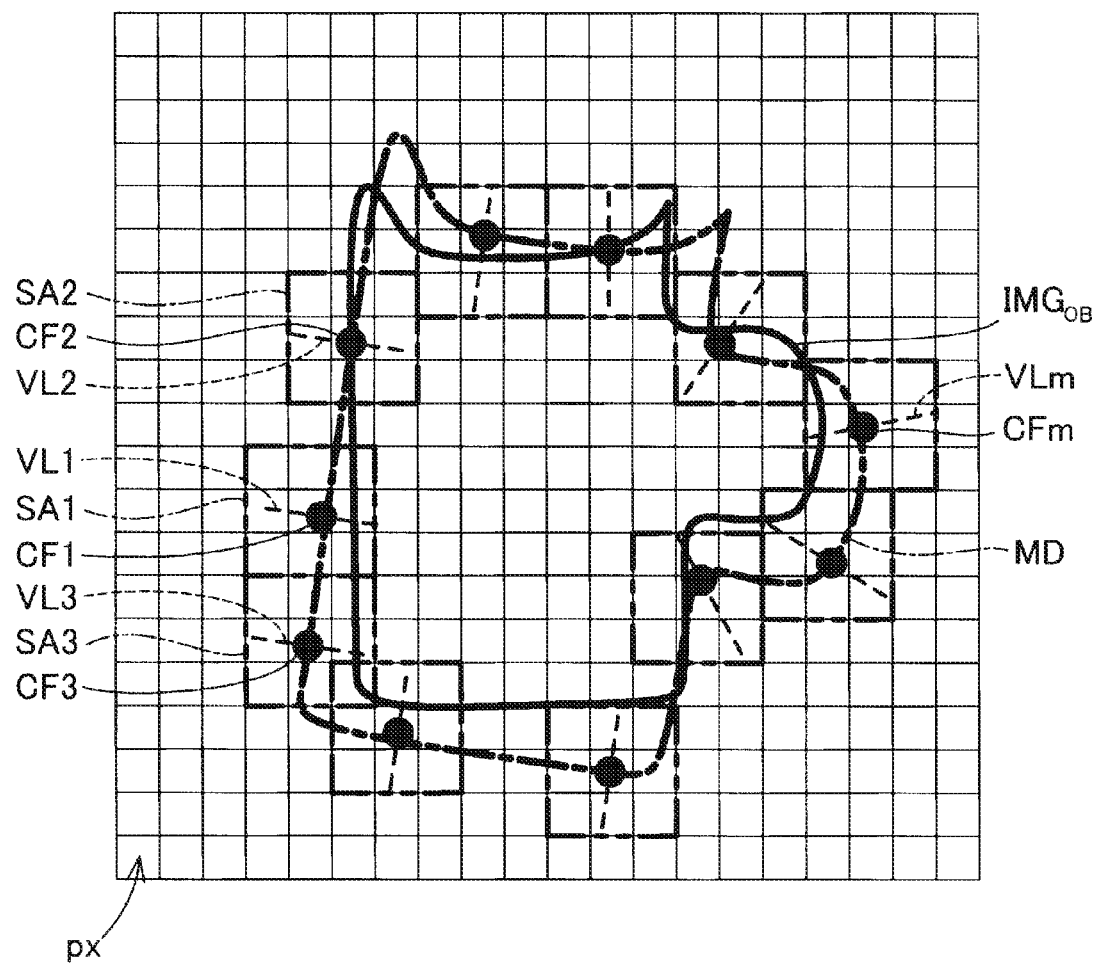
FIG. 19 is a diagram illustrating an example of computation of CF similarity in a second embodiment.
Figure 20:
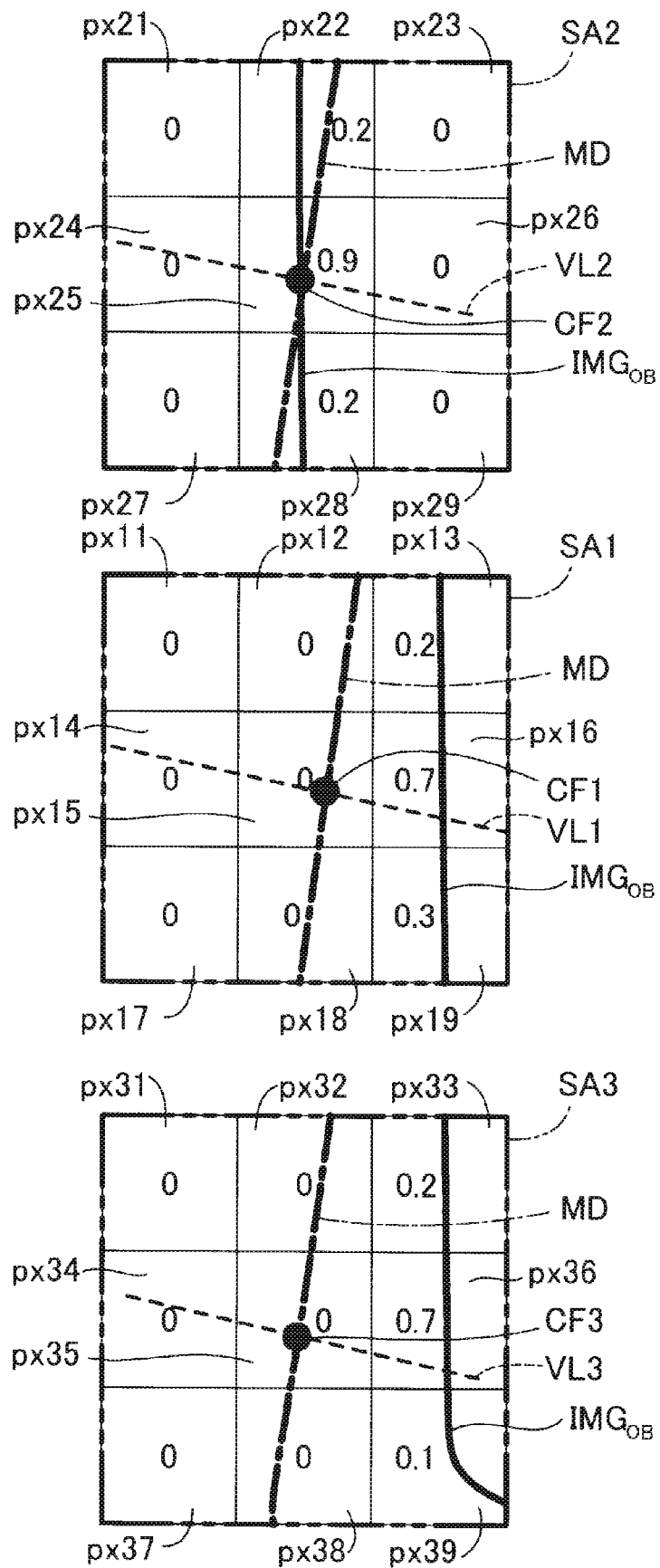
FIG. 20 is a diagram illustrating an example of computation of CF similarity in the second embodiment.
Figure 21:
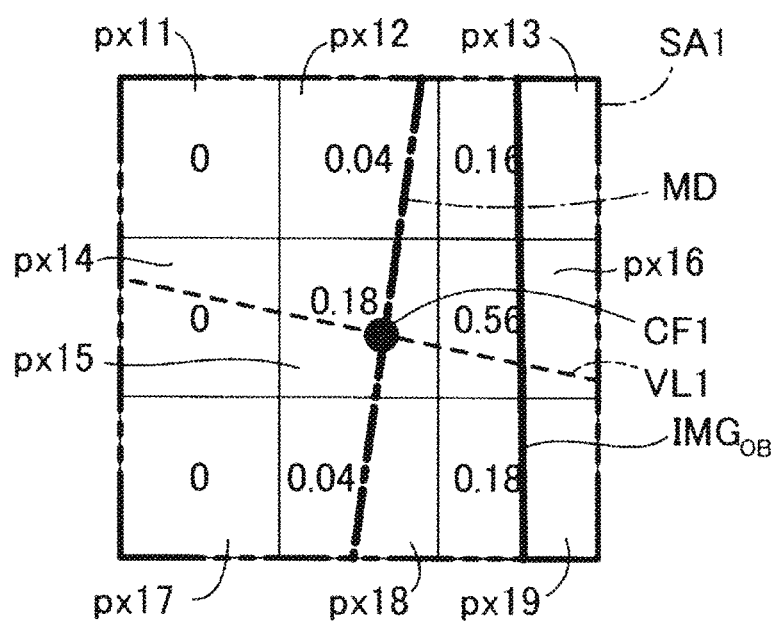
FIG. 21 is a diagram illustrating an example of computation of CF similarity in the second embodiment.

FIGS. 19 to 21 are diagrams illustrating an example of computation of CF similarity in the second embodiment. FIG. 19 further illustrates perpendicular lines VLm which are perpendicular to a contour of a 2D model MD at respective contour features CFm compared with FIG. 10. For example, the perpendicular line VL1 illustrated in FIG. 19 is perpendicular to the contour of the 2D model MD at the contour feature CF1. The perpendicular line VL2 is perpendicular to the contour of the 2D model MD at the contour feature CF2. The perpendicular line VL3 is perpendicular to the contour of the 2D model MD at the contour feature CF3.

In the same manner as in the first embodiment, the location-correspondence determination unit 168 selects the contour feature CF1 as one of the plurality of contour features CFm, and extracts the region SA1 of 3 pixels×3 pixels centering on a pixel px including the contour feature CF1. Next, the location-correspondence determination unit 168 extracts the region SA2 and the region SA3 of 3 pixels×3 pixels respectively centering on the two contour features such as the contour feature CF2 and the contour feature CF3 which are adjacent to the contour feature CF1. The location-correspondence determination unit 168 allocates a score to each pixel px forming each of the regions SA1, SA2 and SA3. In the second embodiment, as described above, a method of the location-correspondence determination unit 168 allocating scores to the regions SA1, SA2 and SA3 is different from the first embodiment.

Hereinafter, a description will be made focusing on a region SA1. The location-correspondence determination unit 168 assumes the perpendicular line VL1 which is perpendicular to a model contour at a 2D model point through the 2D model point represented by the contour feature CF1 in the region SA. The location-correspondence determination unit 168 sets a score of each pixel px (each image point) for the contour feature CF1 by using a plurality of Gaussian functions each of which has the center on the perpendicular line VL1 and which are distributed in a direction (also referred to as a main axis) perpendicular to the line segment VL1. Coordinates the pixel px are represented by integers (m,n), but, in the present embodiment, the center of the pixel px overlapping the perpendicular line VLm is represented by (m+0.5,n+0.5), and a second perpendicular line drawn from the center thereof to the perpendicular line VLm is used as the main axis. Similarity scores of a pixel px overlapping the perpendicular line VL1 and a pixel px overlapping the main axis are computed as follows. First, with respect to the pixel px on the perpendicular line VL1, a value of the central portion of a Gaussian function obtained as a result of being multiplied by a weighting factor which is proportional to a similarity score of the pixel px is used as a new similarity score. Here, the variance of the Gaussian function is selected so as to be proportional to a distance from the contour feature CF1. On the other hand, with respect to the pixel px on the main axis of each Gaussian function, a value of each Gaussian function having a distance from an intersection (the center) between the perpendicular line VL1 and the main axis as a variable, is used as a new similarity score. As a result, for example, the location-correspondence determination unit 168 allocates respective scores of 0.2, 0.7, and 0.3 to the pixels px13, px16 and pixel 19 included in an image IMG$_{OB}$ of the target object although the pixels have almost the same gradient, as illustrated in FIG. 20. This is because distances from the perpendicular line VL1 to the respective pixels px are different from each other.

Next, the location-correspondence determination unit 168 locally smoothes the similarity scores in the same manner as in the first embodiment. The regions SA1, SA2 and SA3 are multiplied by the same weighting factors as in the first embodiment, and thus a corrected score of each pixel forming the region SA1 is calculated. The location-correspondence determination unit 168 determines the maximum score among corrected scores of the pixels forming the region SA1, obtained as a result of the calculation, as the score indicating the correspondence with the contour feature CF1. In the example illustrated in FIG. 21, the location-correspondence determination unit 168 determines 0.56 of the pixel px16 as the score.

D. Third Embodiment

In the present embodiment, the location-correspondence determination unit 168 modifies Equation (11) regarding similarity scores into an equation for imposing a penalty on an image point separated from a perpendicular line which is perpendicular to a model contour. The location-correspondence determination unit 168 defines a model point p and an image point p', a unit length vector which is perpendicular to an edge orientation (contour) of a 2D model as a vector $E_p$, and defines the following Equation (17).

$$\vec{\Delta p} = p' - p \quad (17)$$

If the following Equation (18) is defined by using a weighting factor indicated by w, similarity scores between model points and image points may be expressed as in Equation (19).

$$w(\vec{\Delta p}) = e^{-\left(\|\Delta p\| 2 \Delta p \varepsilon_p\right)/\sigma^2} \quad (18)$$

$$SIM(p, p') = w(\vec{\Delta p}) \left| \vec{E_p} \cdot \vec{v} I_{p'} \right| \Big/ \max_{q \in N(p)} \| \vec{v} I_p \| \quad (19)$$

Next, the location-correspondence determination unit 168 locally smoothes a similarity score of each pixel px in the regions SA1, SA2 and SA3, obtained by using Equation (19), according to the same method as in the first embodiment, and then establishes correspondences between the image points and the contour features CF in each of the regions SA1, SA2 and SA3.

E. Modification Examples

The invention is not limited to the above-described embodiments, and may be implemented in various aspects within the scope without departing from the spirit thereof. For example, the following modification examples may also occur.

E-1. Modification Example 1

In the above-described first and second embodiments, the location-correspondence determination unit 168 computes scores within a region of 3 pixels×3 pixels centering on the contour feature CFm so as to establish a correspondence to a 2D point, but various modifications may occur in a method of computing scores in establishing the correspondences. For example, the location-correspondence determination unit 168 may compute scores within a region of 4 pixels×4 pixels. The location-correspondence determination unit 168 may establish the correspondences between 2D points by using evaluation functions other than that in Equation (11).

In the above-described first embodiment, the location-correspondence determination unit 168 and the optimization unit 166 estimates a pose of an imaged target object by using the CF method, but may estimate a pose of the target object in combination of the CF method and the MA method of the comparative example. The MA method works in a case where the two-color base is established in a target object and a background. Therefore, the location-correspondence determination unit 168 and the optimization unit 166 may select either the CF method or the MA method in order to estimate a pose of a target object according to a captured image. In this case, for example, the location-correspondence determination unit 168 first estimates a pose of a target object according to the MA method. In a case where estimation of a pose of the target object using the MA method does not converge, the location-correspondence determination unit 168 may perform pose estimation again on the basis of an initial pose of the target object by using an algorithm of the CF method. The location-correspondence determination unit 168 can estimate a pose of a target object with higher accuracy by using the method in which the MA method and the CF method are combined, than in a case where an algorithm of only the MA method is used or a case where an algorithm of only the CF method is used.

In the above-described embodiments, one or more processors, such as the CPU 140, may derive and/or track respective poses of two or more target objects within an image frame of a scene captured by the camera 60, using templates (template data) created based on respective 3D models corresponding to the target objects. According to the embodiments, even when the target objects moves relative to each other in the scene, these poses may be derived and/or tracked at less than or equal to the frame rate of the camera 60 or the display frame rate of the right/left optical image display unit 26/28.

The template may include information associated with the target object such as the name and/or geometrical specifications of the target object, so that the one or more processors display the information on the right/left optical display unit 26/28 or present to external apparatus OA through the interface 180 once the one or more processors have derived the pose of the target objet.

The invention is not limited to the above-described embodiments or modification examples, and may be implemented using various configurations within the scope without departing from the spirit thereof. For example, the embodiments corresponding to technical features of the respective aspects described in Summary of Invention and the technical features in the modification examples may be exchanged or combined as appropriate in order to solve some or all of the above-described problems, or in order to achieve some or all of the above-described effects. In addition, if the technical feature is not described as an essential feature in the present specification, the technical feature may be deleted as appropriate.

The entire disclosure of Japanese Patent Application No. 2016-065733, filed on Mar. 29, 2016, expressly incorporated by reference herein.

What is claimed is:

1. An information processing device comprising:
    a processor that communicates with a camera that captures an image of a target object; and
    a memory that acquires at least one template in which first feature information, 3D locations and a viewpoint are associated with each other, the first feature information including information that represents a plurality of first 2D locations included in a contour obtained from a projection of a 3D model corresponding to the target object onto a virtual plane based on the viewpoint, and the 3D locations corresponding to respective first 2D locations and being represented in a 3D coordinate system,
    wherein the processor
    identifies second feature information representing edges from the captured image of the target object obtained from the camera, and determines correspondences between the first 2D locations and second 2D locations in the captured image based at least on the first feature information and the second feature information,
    derives a position and pose of the target object, using at least (1) the 3D locations that correspond to the respective first 2D locations and (2) the second 2D locations that correspond to the respective first 2D locations,
    derives similarity scores between each of the first 2D locations and the second 2D locations within a region around a corresponding first 2D location,
    smooths the similarity scores derived with respect to the region, using other similarity scores derived with respect to other regions around other first 2D locations adjacent to the corresponding first 2D location, and
    determines a correspondence between each of the first 2D locations and one of the second 2D locations within the region around the corresponding first 2D location based on at least the smoothed similarity scores.

2. An information processing device according to claim 1, wherein
    the first feature information includes contour information representing an orientation of the contour at each of the first 2D locations, and
    the processor derives the similarity scores between each of the first 2D locations and the second 2D locations that overlap a first line segment perpendicular to the contour at the respective first 2D location within the region around the corresponding first 2D location.

3. An information processing device according to claim 2, wherein the 3D model is a 3D CAD model.

4. An information processing device according to claim 1, wherein
    the first feature information includes contour information representing an orientation of the contour at each of the first 2D locations, and
    the processor (1) derives the similarity scores between each of the first 2D locations and the second 2D locations that overlap a first line segment perpendicular to the contour at the corresponding first 2D location within the region around the corresponding first 2D location, and (2) derives the similarity scores between each of the first 2D locations and the second 2D locations that overlap a second segment perpendicular to the first line segment, using a Gaussian function defined at least by a center of function at a cross section of the first line segment and the second line segment.

5. An information processing device according to claim 4, wherein the 3D model is a 3D CAD model.

6. An information processing device according to claim 1, wherein the 3D model is a 3D CAD model.

7. A non-transitory computer-readable storage medium embedded with a computer program for an information processing device, the computer program causing the information processing device to realize functions of:
    (a) communicating with a camera that captures an image of a target object;
    (b) acquiring at least one template in which first feature information, 3D locations and a viewpoint are associated with each other, the first feature information including information that represents a plurality of first 2D locations included in a contour obtained from a projection of a 3D model corresponding to the target object onto a virtual plane based on the viewpoint, and the 3D locations corresponding to the respective first 2D locations and being represented in a 3D coordinate system;
    (c) identifying second feature information representing edges from the captured image of the target object obtained from the camera;
    (d) determining correspondences between the first 2D locations and second 2D locations in the captured image based at least on the first feature information and the second feature information;
    (e) deriving a position and pose of the target object, using (1) the 3D locations that correspond to the respective first 2D locations and (2) the second 2D locations that correspond to the respective first 2D locations;
    (f) deriving similarity scores between each of the first 2D locations and the second 2D locations within a region around a corresponding first 2D location;

(g) smoothing the similarity scores derived with respect to the region, using other similarity scores derived with respect to other regions around other first 2D locations adjacent to the corresponding first 2D location; and (h) determining a correspondence between each of the first 2D locations and one of the second 2D locations within the region around the corresponding first 2D location based on at least the smoothed similarity scores.

8. A method for controlling an information processing device, comprising:

(a) communicating with a camera that captures an image of a target object;

(b) acquiring at least one template in which first feature information, 3D locations and a viewpoint are associated with each other, the first feature information including information that represents a plurality of first 2D locations included in a contour obtained from a projection of a 3D model corresponding to the target object onto a virtual plane based on the viewpoint, and the 3D locations corresponding to the respective first 2D locations and being represented in a 3D coordinate system;

(c) identifying second feature information representing edges from the captured image of the target object obtained from the camera;

(d) determining correspondences between the first 2D locations and second 2D locations in the captured image based at least on the first feature information and the second feature information;

(e) deriving a position and pose of the target object, using (1) the 3D locations that correspond to the respective first 2D locations and (2) the second 2D locations that correspond to the respective first 2D locations;

(f) deriving similarity scores between each of the first 2D locations and the second 2D locations within a region around a corresponding first 2D location;

(g) smoothing the similarity scores derived with respect to the region, using other similarity scores derived with respect to other regions around other first 2D locations adjacent to the corresponding first 2D location; and (h) determining a correspondence between each of the first 2D locations and one of the second 2D locations within the region around the corresponding first 2D location based on at least the smoothed similarity scores.

* * * * *